United States Patent
Ranjan et al.

(10) Patent No.: US 12,230,475 B2
(45) Date of Patent: Feb. 18, 2025

(54) SYSTEMS AND METHODS OF CONTROL FOR PLASMA PROCESSING

(71) Applicant: Tokyo Electron Limited, Tokyo (JP)

(72) Inventors: Alok Ranjan, Austin, TX (US); Peter Ventzek, Austin, TX (US); Mitsunori Ohata, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 615 days.

(21) Appl. No.: 16/219,535

(22) Filed: Dec. 13, 2018

(65) Prior Publication Data

US 2020/0058469 A1    Feb. 20, 2020

Related U.S. Application Data

(60) Provisional application No. 62/724,879, filed on Aug. 30, 2018, provisional application No. 62/718,454, filed on Aug. 14, 2018.

(51) Int. Cl.
*H01J 37/32* (2006.01)
*C23C 16/455* (2006.01)
(Continued)

(52) U.S. Cl.
CPC .. *H01J 37/32146* (2013.01); *C23C 16/45536* (2013.01); *H01J 37/3211* (2013.01);
(Continued)

(58) Field of Classification Search
USPC ............. 156/345.25, 345.26, 345.27, 345.28
See application file for complete search history.

(56) References Cited

U.S. PATENT DOCUMENTS 5,304,282 A * 4/1994 Flamm .............. H01J 37/32082
    118/723 E
5,928,528 A    7/1999 Kubota et al.
(Continued)

FOREIGN PATENT DOCUMENTS

CN    1363721 A    8/2002
CN    1619011 A    5/2005
(Continued)

OTHER PUBLICATIONS

Ken Tokashiki et al. "Synchronous Pulse Plasma Operation upon Source and Bias Radio Frequencys for Inductively Coupled Plasma for Highly Reliable Gate Etching Technology", Japanese Journal of Applied Physics 48 (2009) 08HD01.
(Continued)

*Primary Examiner* — Ram N Kackar
(74) *Attorney, Agent, or Firm* — Slater Matsil, LLP

(57) ABSTRACT

A plasma processing system includes a vacuum chamber, a first coupling electrode, a substrate holder disposed in the vacuum chamber, a second coupling electrode, and a controller. The substrate holder is configured to support a substrate. The first coupling electrode is configured to provide power for generation of a plasma in the vacuum chamber. The first coupling electrode is further configured to couple source power pulses to the plasma. The second coupling electrode is configured to couple bias power pulses to the substrate. The controller is configured to control a first offset duration between the source power pulses the bias power pulses.

18 Claims, 11 Drawing Sheets

(51) Int. Cl.
  *H01L 21/3065* (2006.01)
  *H01L 21/67* (2006.01)
  *H01L 21/683* (2006.01)

(52) U.S. Cl.
  CPC .... *H01L 21/3065* (2013.01); *H01L 21/67069* (2013.01); *H01L 21/6831* (2013.01); *H01J 2237/332* (2013.01); *H01J 2237/334* (2013.01)

(56) References Cited

U.S. PATENT DOCUMENTS

| | | | |
|---|---|---|---|
| 8,735,291 | B2 | 5/2014 | Ranjan et al. |
| 9,159,575 | B2 | 10/2015 | Ranjan et al. |
| 9,257,294 | B2 | 2/2016 | Rueger |
| 9,514,967 | B2 | 12/2016 | Ohgoshi et al. |
| 9,570,313 | B2 | 2/2017 | Ranjan et al. |
| 9,583,357 | B1 | 2/2017 | Long et al. |
| 9,726,621 | B1* | 8/2017 | Bahr ............ H05H 3/06 |
| 9,831,064 | B2 | 11/2017 | Konno et al. |
| 9,870,898 | B2 | 1/2018 | Urakawa et al. |
| 10,755,895 | B2 | 8/2020 | Marakhtanov et al. |
| 2001/0051438 | A1 | 12/2001 | Shin et al. |
| 2002/0115301 | A1 | 8/2002 | Savas |
| 2002/0160125 | A1 | 10/2002 | Johnson et al. |
| 2003/0070759 | A1 | 4/2003 | Aota et al. |
| 2005/0103623 | A1 | 5/2005 | Tolmachev et al. |
| 2006/0121704 | A1 | 6/2006 | Walther et al. |
| 2008/0317965 | A1 | 12/2008 | Son et al. |
| 2009/0207537 | A1 | 8/2009 | Coumou |
| 2009/0255800 | A1 | 10/2009 | Koshimizu |
| 2009/0294062 | A1* | 12/2009 | Shannon ............ H01J 37/32935 156/345.24 |
| 2010/0130018 | A1* | 5/2010 | Tokashiki ......... H01J 37/32082 438/710 |
| 2010/0243607 | A1 | 9/2010 | Ohse et al. |
| 2010/0248488 | A1 | 9/2010 | Agarwal et al. |
| 2010/0273332 | A1 | 10/2010 | Edelberg |
| 2010/0315064 | A1 | 12/2010 | Kuthi et al. |
| 2011/0139748 | A1 | 6/2011 | Donnelly et al. |
| 2011/0143537 | A1 | 6/2011 | Lee et al. |
| 2013/0059448 | A1 | 3/2013 | Marakhtanov et al. |
| 2013/0105443 | A1* | 5/2013 | Banna ............... H01J 37/32146 216/67 |
| 2013/0222055 | A1 | 8/2013 | Coumou et al. |
| 2014/0118031 | A1 | 5/2014 | Rughoonundon et al. |
| 2014/0262755 | A1 | 9/2014 | Deshmukh et al. |
| 2014/0273487 | A1* | 9/2014 | Deshmukh ......... H01L 21/6875 438/714 |
| 2015/0076112 | A1 | 3/2015 | Sriraman et al. |
| 2017/0098527 | A1 | 4/2017 | Kawasaki et al. |
| 2017/0099722 | A1* | 4/2017 | Kawasaki ......... H01J 37/32183 |
| 2017/0103873 | A1 | 4/2017 | Kawasaki |
| 2017/0186586 | A1 | 6/2017 | Oh et al. |
| 2017/0229312 | A1 | 8/2017 | Park et al. |
| 2017/0365445 | A1 | 12/2017 | Kubota |
| 2018/0226227 | A1 | 8/2018 | Donnelly et al. |
| 2021/0398777 | A1 | 12/2021 | Shiina et al. |

FOREIGN PATENT DOCUMENTS

| | | |
|---|---|---|
| CN | 1983351 A | 6/2007 |
| CN | 101843178 A | 9/2010 |
| CN | 102024658 A | 4/2011 |
| CN | 102934208 A | 2/2013 |
| CN | 103903949 A | 7/2014 |
| CN | 103915308 A | 7/2014 |
| CN | 104465291 A | 3/2015 |
| CN | 104465296 A | 3/2015 |
| CN | 104733278 A | 6/2015 |
| CN | 106449396 A | 2/2017 |
| CN | 106920734 A | 7/2017 |
| CN | 107039263 A | 8/2017 |
| JP | 1996045903 A | 2/1996 |
| JP | 2001322534 A | 11/2001 |
| JP | 2001332534 A | 11/2001 |
| JP | 2001358129 A | 12/2001 |
| JP | 2016511551 A | 4/2016 |
| JP | 2017069542 A | 4/2017 |
| KR | 20120027159 A | 3/2012 |
| KR | 101703366 B1 | 2/2017 |
| TW | 201108871 A | 3/2011 |
| TW | I374271 B | 10/2012 |
| TW | 201533797 A | 9/2015 |
| TW | 201643956 A | 12/2016 |
| TW | I584700 B | 5/2017 |
| TW | 201722213 A | 6/2017 |
| TW | 201724920 A | 7/2017 |
| TW | I604498 | 11/2017 |
| TW | 201810419 A | 3/2018 |
| WO | 2014159144 A1 | 10/2014 |

OTHER PUBLICATIONS

Samer Banna et al. "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009.

K Niazi, A J Lichtenberg, MA Lieberman, and DL Flamm, "Operation of a helical resonator plasma source", Plasma Sources Sci. Technol. 3 (1994) 482-495.

John H Keller, "New and possible future trends in inductively coupled plasmas (ICPs) for semiconductor processing", Plasma Phys. Control. Fusion 39 (1997) A437-A443.

John H Keller, "Inductive plasmas for plasma processing", Plasma Sources Sci. Technol. 5 (1996) 166-172.

R BR Piejak, V A Godyak and B M Alexandrovich, "A simple analysis of an inductive RF discharge", Plasma Sources Sci. Technol. 1 (1992) 179-186.

G. Carter, and J.S. Colligon, "Ion Bombardment of Solids", American Elsevier Publishing, Inc. (1968) 30-75.

PCT International Search Report and Written Opinion, International Application No. PCT/US2019/045756, dated Nov. 27, 2019, 11 pages.

China National Intellectual Property Administration, "Notification of the Second Office Action," Application No. 201980051970.5, Issue Serial No. 2024080701462430, Issue Date: Aug. 7, 2024, 7 pages.

* cited by examiner

SYSTEMS AND METHODS OF CONTROL FOR PLASMA PROCESSING

CROSS-REFERENCE TO RELATED APPLICATIONS

This application claims priority to U.S. Provisional Application No. 62/718,454, filed on Aug. 14, 2018 and U.S. Provisional Application No. 62/724,879, filed on Aug. 30, 2018, which applications are hereby incorporated by reference in their entirety.

TECHNICAL FIELD

The present invention relates generally to plasma processing, and, in particular embodiments, to systems and methods of control for plasma processing.

BACKGROUND

The manufacture of semiconductor devices involves a series of techniques including formation, patterning, and removal of a number of layers of material on a substrate. In order to achieve the physical and electrical specifications of current and next generation semiconductor devices, processing flows enabling reduction of feature size while maintaining structural integrity are desirable for various patterning processes. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters nanometer-scale semiconductor device fabrication nodes. Therefore, there is a desire for three-dimensional (3D) semiconductor devices in which transistors are stacked on top of each other.

As device structures densify and develop vertically, the desire for precision material processing becomes more compelling. Trade-offs between selectivity, profile control, film conformality, and uniformity in plasma processes can be difficult to manage. Thus, equipment and techniques that isolate, and control the process conditions that are optimal for etch and deposition regimes are desirable in order to precisely manipulate materials and meet advanced scaling challenges.

Plasma processes are commonly used in the manufacture of semiconductor devices. For example, plasma etching and plasma deposition are common process steps during semiconductor device fabrication. A combination of source power and bias power may be used to generate and direct plasma during plasma processing. FIG. 16 illustrates conventional timing diagrams for the application of source power and bias power during plasma processing. In the top diagram, there are no distinct pulses for the source power or the bias power. In the middle diagram, continuous bias power is applied with no pulses while 100 μs source pulses are applied. In the bottom diagram, continuous source power is applied with no pulses while 80 μs bias pulses are applied.

SUMMARY

In accordance with an embodiment, a plasma processing system includes a vacuum chamber, a first coupling electrode, a substrate holder disposed in the vacuum chamber, a second coupling electrode, and a controller. The substrate holder is configured to support a substrate. The first coupling electrode is configured to provide power for generation of a plasma in the vacuum chamber. The first coupling electrode is further configured to couple source power pulses to the plasma. The second coupling electrode is configured to couple bias power pulses to the substrate. The controller is configured to control a first offset duration between the source power pulses the bias power pulses.

In accordance with another embodiment, an apparatus includes a vacuum chamber, a coupling electrode, and a substrate holder. The coupling electrode is coupled to a source power supply node and configured to generate a plasma within the vacuum chamber using a first sequence of source power pulses. The substrate holder is coupled to a bias power supply node and disposed within the vacuum chamber. The substrate holder is configured to support a substrate to be processed by the plasma. A second sequence of bias power pulses is configured to accelerate ions of the plasma towards the substrate.

In accordance with still another embodiment, a method of plasma processing includes outputting a first signal to a first function generator using a first pulse modulation circuit, generating a first source power pulse using the first function generator in response to the outputting the first signal, providing the first source power pulse at a first coupling electrode of a vacuum chamber to generate a plasma, generating a bias power pulse by triggering a delay relative to the first source power pulse, providing the bias power pulse at a second coupling electrode of the vacuum chamber, and performing a plasma deposition or etch process on a substrate disposed in the vacuum chamber. Providing the bias power pulse accelerates ions from the plasma towards the substrate.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
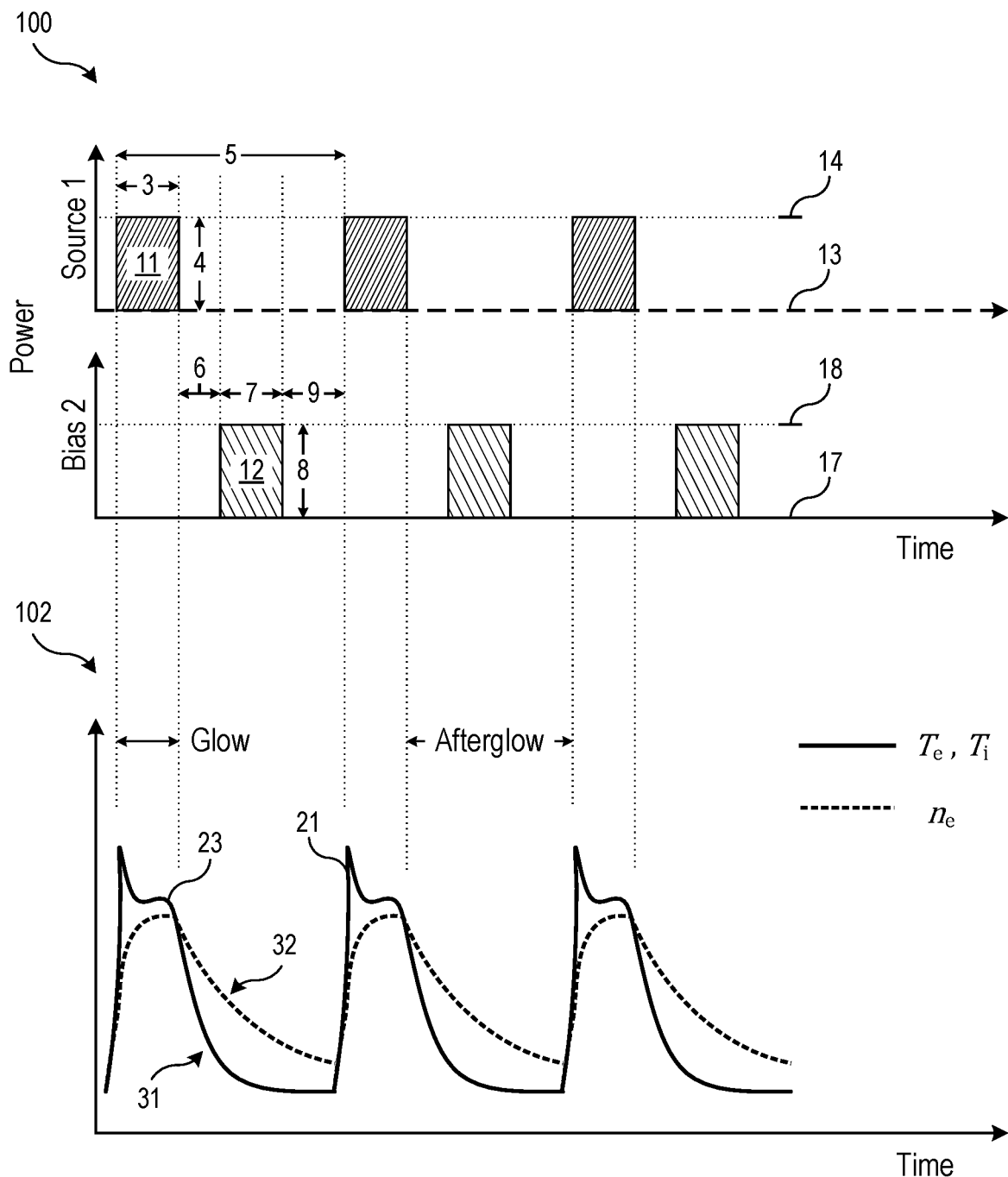
FIG. 1 illustrates a schematic timing diagram of a pulse sequence and a corresponding qualitative graph of an example method of plasma processing that includes source power pulses and bias power pulse in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques, as described herein, pertain to device fabrication using precision plasma processing techniques, including etch and deposition processes. Several instances manifest in semiconductor manufacturing in both front end of line (FEOL, e.g., transistor fabrication) through to the back end of line (BEOL, e.g., interconnect fabrication), where materials are to be manipulated with a high degree of precision. Conventional plasma processing apparatus and methods may be lacking in control of plasma properties, including control of radical populations and compositions, control of ion populations, and control of electron populations, as well as reaction by-products, and thus, have been deficient in meeting advanced scaling requirements.

When using plasma to manipulate material at nanometer scales on a workpiece surface for advanced device topologies, it may be desirable to precisely control one or more plasma properties such as ion energy distributions (IEDF), ion temperature ($T_i$), ion angular distributions (IADF), electron energy distributions (EEDF), electron temperature ($T_e$), for example. Traditional plasma process parameters, such as gas pressure, power, and more specifically, the manner in which electromagnetic fields are coupled to a gas environment in order to form plasma (e.g., capacitive coupling, inductive coupling, etc.) may impact these plasma properties. However, to meet the needs of present and future state-of-the-art device fabrication, relatively more complex methodologies may be beneficial so that plasma properties such as IEDF, $T_i$, IADF, and the like may be effectively manipulated to achieve differentiated target outcomes on the fabrication workpiece.

For example, it is widely accepted that no active control mechanism exists in the art to control the angle of ions incident on a topographical feature of a microelectronic device during plasma processing. It may be beneficial to deliver absolutely vertical or substantially vertical ions to the substrate surface. Additionally, it may also be beneficial to control the angle of ion beams delivered into structures while accounting for and/or correcting for scattering on sidewalls of patterned structures. For example, this control of ion distribution angle could be useful for high aspect ratio contact (HARC) type etches and patterning applications as well as other etch/deposition processes.

Various embodiments described herein provide systems and methods to control plasma properties for the delivery of ions for plasma processing such as in reactive ion etching or plasma deposition. The various embodiments may provide antiphased, antisynchronous, and/or out-of-phase source power and bias power pulsing for plasma processing. The pulsing may be controlled using plasma processing parameters including pulse width, frequency, and amplitude for both source power and bias power as well as one or more offsets between pulses. Using the plasma processing parameters, bias power pulses may be pulsed in a delayed manner from the source plasma or at the same time as the source plasma. Various plasma properties such as ion temperature $T_i$, electron temperature $T_e$, electron density $n_e$, sheath voltage drop $V_{sheath}$, plasma bulk potential $V_P$, and the like may be modulated and controlled using the embodiment systems and methods as described herein.

Embodiments provided below describe various systems and methods of operating plasma processing systems, and in particular, methods of plasma processing that include source power pulses and bias power pulses. The following description describes the embodiments. An example schematic timing diagram and a qualitative graph of an embodiment method of control for plasma processing that includes source power pulses and bias power pulses are described using FIG. 1. An embodiment plasma processing system including a source pulse modulation circuit and a pulse modulation timing circuit is described using FIG. 2. Two embodiment methods of plasma processing including bias pulses with positive and negative leading offsets relative to source pulses are described using FIG. 3. Two embodiment methods of plasma processing including bias pulses with negative and positive trailing offsets relative to source pulses are described using FIG. 4. An embodiment method of plasma processing including bias pulses with dynamic offsets is described using FIG. 5. An embodiment method of plasma processing including bias power pulse trains is described using FIG. 6. An embodiment method of plasma processing including source pulse and bias pulse timing associated with particular gas flows is described using FIG. 7. Several embodiment plasma processing systems are described using FIGS. 8-11. Two embodiment plasma processing systems including a source pulse modulation circuit and a pulse modulation timing circuit are described using FIGS. 12 and 13. An embodiment helical resonator plasma processing system is described using FIG. 14. An embodiment method of plasma processing is described using FIG. 15.

FIG. 1 illustrates a schematic timing diagram of a pulse sequence and a corresponding qualitative graph of an example method of control for plasma processing that includes source power pulses and bias power pulses in accordance with an embodiment of the invention. The source power is coupled to a plasma processing chamber of a plasma processing system and is used to generate a plasma for processing of a microelectronic workpiece. The bias power is also coupled to the plasma processing chamber and may be used to accelerate ions toward a surface of the microelectronic workpiece in addition to other functions.

Referring to FIG. 1, a timing diagram 100 includes a source power 1 and a bias power 2 which are pulsed to generate and deliver ions to a microelectronic workpiece (e.g., a semiconductor wafer). Specifically, timing diagram 100 includes a pulse sequence with one or more source power (SP) pulses 11 and bias power (BP) pulses 12 which are at least partially non-overlapping in time. For example, the source power 1 may be alternating current (AC) power which is switched between an on state and an off state to generate the SP pulses 11 (the frequency of the AC power is higher than the frequency of the SP pulses 11). Similarly, the bias power 2 may also be AC power. Alternatively, one or both of the source power 1 and the bias power 2 may be DC power.

In various embodiments, the pulse sequence is periodic with a pulse modulation period 5 and includes multiple SP pulses 11 and BP pulses 12. However, in some cases, a pulse sequence may refer to a single SP pulse and a single BP pulse. Further, although periodicity may be beneficial, there is no strict requirement that the pulse sequence be periodic or that the SP pulses have the same period as the BP pulses.

As shown in graph 102, the temperature curve 31 and the density curve 32 of the generated plasma change in accordance with the applied source power 1 of timing diagram 100. SP pulses 11 generate a plasma glow phase characterized by an increase in various plasma parameters such as the electron density $n_e$, electron temperature $T_e$, and the ion temperature $T_i$. Initial application of a SP pulse 11 may result in a spike 21 in plasma temperature (e.g., $T_e$ and $T_i$) which relaxes to a pseudo-equilibrium state 23 for the remainder of the SP pulse. After the SP pulse ends, the plasma enters an afterglow phase during which the ions and electrons may cool down resulting in decreases in $T_e$, $T_i$. The electrons and ions diffuse to the walls by ambipolar diffusion resulting in decreases in $n_e$. In various embodiments, during the afterglow phase, a BP pulse is applied to accelerate the generated ions towards a surface of a microelectronic workpiece.

As illustrated in graph 102, $T_e$ and $T_i$ may decrease more rapidly than $n_e$ in the afterglow phase. Since the electron density $n_e$ is correlated with available ions, applications of a BP pulse during the afterglow phase may be particularly effective in order to accelerate low-temperature ions to the surface of the microelectronic workpiece. During the afterglow phase, the plasma current may also decrease. This current drop may allow for a large voltage difference $V_p$ across the plasma sheath and $V_{DC}$ (RF DC self-bias voltage) in the afterglow phase when bias power is applied (e.g., using a BP pulse). The increased voltage difference $V_p$ and the time-average drop dc voltage drop $V_{DC}$ along with the lower ion temperature may improve the directionality of the ion flux.

Therefore, the SP pulses and BP pulses are at least partially non-overlapping in time. In one embodiment, the SP pulses and BP pulses are completely out-of-phase as illustrated in the timing diagram 100. In other embodiments, the SP pulses and BP pulses may partially overlap. Accordingly, embodiments of the method include both a nonzero interval of time during which the source power 1 is applied without the bias power 2, as well as including a nonzero interval of time during which the bias power 2 is applied without the source power 1.

Still referring to FIG. 1, the pulse sequence of timing diagram 100 may be generated using pulse modulation process parameters. The pulse modulation process parameters may include SP pulse width 3 and SP pulse amplitude 4 corresponding to the source power 1 sequence as well as a leading edge bias offset 6, BP pulse width 7, BP pulse amplitude 8, and a trailing edge bias offset 9 corresponding to the bias power 2 sequence. In particular, each SP pulse 11 includes a SP pulse width 3 and an SP pulse amplitude 4 while each BP pulse 12 includes a BP pulse width 7 and a BP pulse amplitude 8. It should be mentioned that unless otherwise noted, amplitude as used herein refers to the average peak-to-peak amplitude of a given pulse.

For both the SP pulses 11 and BP pulses 12, a specific pulse width may be implemented by choosing a duty cycle (%) for a given pulse modulation period 5. For example, if the pulse modulation period is set to 150 µs, a 56% source power duty cycle (%) and a 28% bias power duty cycle (%) would result in an 84 µs SP pulse width and a 42 µs BP pulse width. In one embodiment, the source power 1 and the bias power 2 have the same pulse modulation period. Alternatively, source power 1 and bias power 2 may operate with separate pulse modulation period. In various embodiments, the duty cycle (%) of either of the SP pulses 11 and BP pulses 12 may range from about 3% to about 90%. In one embodiment, the duty cycle (%) of the SP pulses 11 is about 5%. In another embodiment, the duty cycle (%) of the SP pulses 11 is about 50%. In still another embodiment, the duty cycle (%) of both the SP pulses 11 and the BP pulses 12 is about 40%. Suitable duty cycles (%) for the SP pulses 11 and BP pulses 12 may be chosen according to specific properties of a given plasma process.

The duration of any of the pulse widths described herein may have any suitable value as chosen based on specific parameters of a given plasma process. For example, the SP pulse width 3 may range between about 10 µs and about 100 µs. Alternatively, the SP pulse width 3 may be larger or smaller. For example, the SP pulse width 3 may be on the order of milliseconds in some embodiments. Similarly, the BP pulse width 7 may range between 10 µs and about 100 µs, but can also be larger or smaller as with the SP pulse width 3. Furthermore, the SP pulse width 3 and the BP pulse width 7 may be independently chosen according to a given plasma process.

As illustrated in FIG. 1, a delay between SP pulses 11 and BP pulses 12 may be referred to as a leading edge bias offset 6. The leading edge bias offset 6 may be implemented as a percentage of the pulse modulation period 5. For example, the leading edge bias offset may vary between −10% to +10% of the pulse modulation period 5. Alternatively, the leading edge bias offset 6 may set as a specific time value. For example, continuing the above case where the source power 1 and the bias power 2 have the same pulse modulation period set to 150 µs, a leading edge bias offset of 10% would result in a 15 µs delay between the trailing edge of a SP pulse and a BP pulse. In the foregoing example, the leading edge bias offset 6 is set to be positive. However, the leading edge bias offset 6 may also be zero or negative.

Similarly, a delay between BP pulses 12 and SP pulses 11 may be referred to as a trailing edge bias offset 9 and may be implemented through a combination of the SP pulse width 3, the leading edge bias offset 6, and the BP pulse width 7. Continuing the above example, a 56% source power duty cycle (%), a leading edge bias offset of 10%, and a 28% bias power duty cycle (%) accounts for 94% of a complete pulse modulation period. Therefore, in this specific example, there is a delay equal to 6% of the pulse modulation period between the trailing edge of a BP pulse and the leading edge of a SP pulse. Since the pulse modulation period is 150 µs, this delay which is the trailing edge bias offset 9 is equal to 9 µs. Similar to the leading edge bias offset 6, the trailing edge bias offset 9 is not required to be positive, but may also be zero or negative.

The duration of any of the offsets described herein may have any suitable value as chosen based on specific parameters of a given plasma process. For example, the leading edge bias offset 6 may range between about −50 µs and about 50 µs. In various embodiments, the leading edge bias offset 6 may be between about −15 µs and about 20 µs. In one embodiment, the leading edge bias offset 6 is about 20 µs. In another embodiment, the leading edge bias offset 6 is about to 10 µs. In still another embodiment, the leading edge bias offset 6 is about 1 µs.

The pulse amplitudes may have corresponding high and low amplitude states. For example, the high and low amplitudes may be voltage levels. Specifically, each of the SP pulses 11 may oscillate between a SP low amplitude state 13 and a SP high amplitude state 14 while each of the BP pulses 12 may oscillate between a BP low amplitude state 17 and a BP high amplitude state 18. A positive or negative DC bias may be applied to one or both the source power 1 or the bias power 2 so that the respective high and low amplitudes are brought to desirable levels.

It should be mentioned that both the temperature curve 31 and density curve 32 are qualitative in nature. Therefore, while both may be indicative of important phenomena associated with the effect of a pulse sequence on plasma parameters such as $T_e$, $T_i$, and $n_e$, neither are intended to be drawn with a specific scale or be quantitatively accurate. Furthermore, simplifications may have been made for the sake of clarity. For example, the electron temperature $T_e$ and the ion temperature $T_i$ have been represented as a single curve in graph 102 because the shape of the curves is similar even though $T_e$ may be at least an order of magnitude greater than $T_i$ in a cold plasma.

Figure 2:
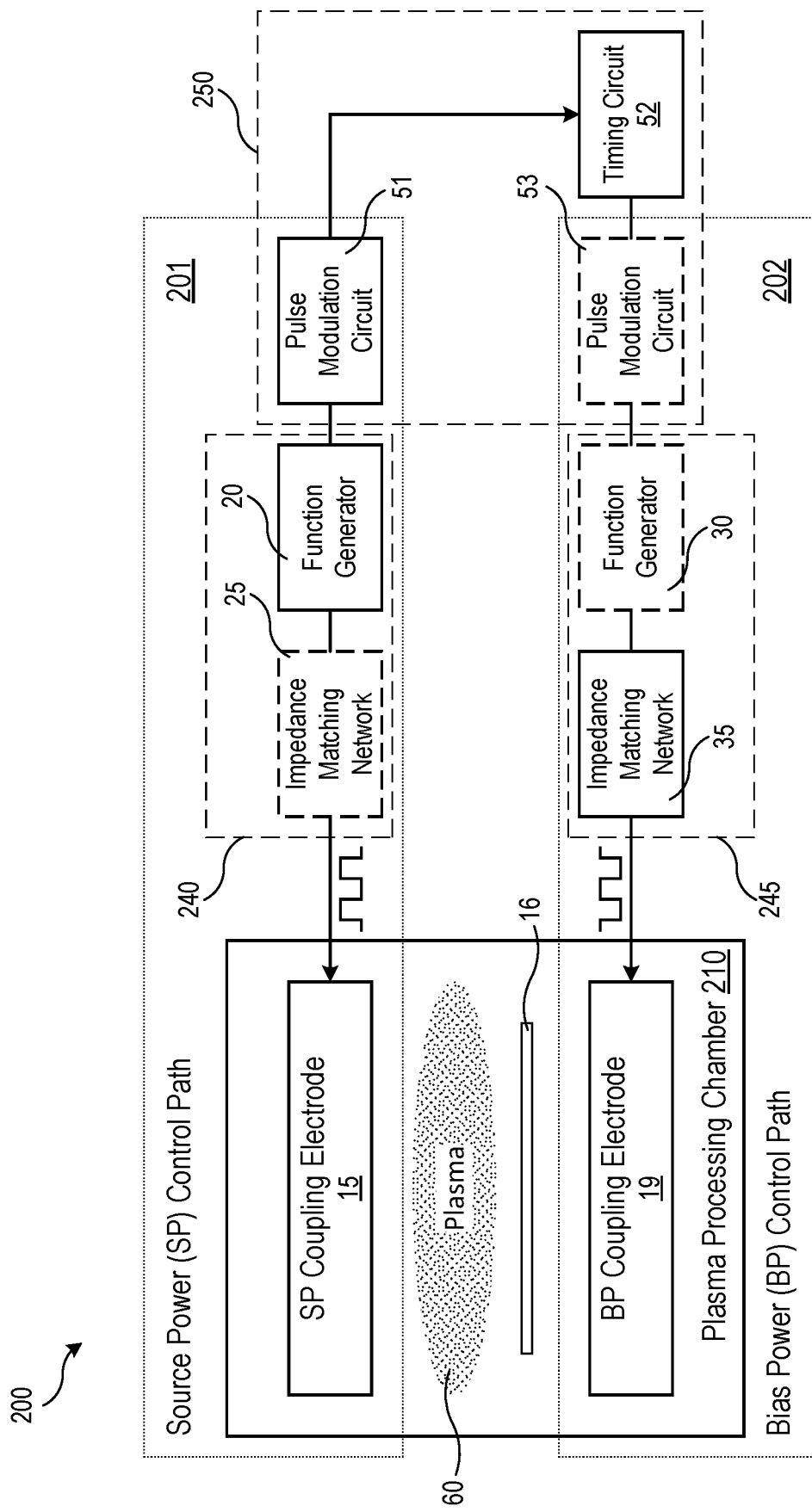
FIG. 2 illustrates a block diagram of an example plasma processing system including a source pulse modulation circuit and a pulse modulation timing circuit in accordance with an embodiment of the invention.

FIG. 2 illustrates a block diagram of an example plasma processing system including a source pulse modulation circuit and a pulse modulation timing circuit in accordance with an embodiment of the invention. The plasma processing system of FIG. 2 may be used to perform any of the embodiment methods as described herein, such as the method of FIG. 1, for example.

Referring to FIG. 2, a plasma processing system 200 includes a SP coupling electrode 15 coupled to a plasma processing chamber 210. For example, the plasma processing chamber 210 may include a vacuum chamber. The SP coupling electrode may allow application of source power to the plasma processing chamber 210 resulting in the generation of a plasma 60. In various embodiments, the SP coupling electrode 15 is a conductive coil positioned around the plasma processing chamber 210 and is a quarter-wave helical resonator in one embodiment. In another embodiment, the SP coupling electrode 15 is a half-wave helical resonator. Alternatively, other SP coupling electrodes may be employed, such as an antenna, plate electrode, or a waveguide, as examples.

The plasma processing system 200 further includes a BP coupling electrode 19 coupled to the plasma processing chamber 205. The BP coupling electrode 19 may enable application of bias power to a microelectronic workpiece being processed. In various embodiments, the BP coupling electrode 19 is a substrate holder and is an electrostatic chuck in one embodiment.

The source power may be coupled to the plasma processing chamber 210 using a SP control path 201 which includes a SP pulse modulation circuit 51. The SP pulse modulation circuit 51 may modulate a source signal between a SP high amplitude state 14 and a SP low amplitude state 13. For example, the modulated source signal may correspond with the SP pulses 11 as described in reference to FIG. 1. The modulated source signal may be received by a SP function generator 20 which may superimpose a waveform onto the modulated source signal. As a person of skill in the art may recognize, a pulse modulation circuit, such as the SP pulse modulation circuit 51, can be implemented, e.g., using a laser driver capable of generating high power pulses for laser diodes such as AVTECH AVOZ-D2-B pulse generator type circuits, for example.

The SP function generator 20, which may be implemented using any function generator as would be known to a person skilled in the art, such as a 2235A HP function generator in one specific example, may also optionally include an amplification circuit such as an RF amplifier, configured to increase the amplitude of the modulated source signal. In various embodiments, the SP function generator 20 may be a signal generator, and may be a radio frequency (RF) signal generator in one embodiment. Alternatively, the SP function generator 20 may be a microwave function generator. In one embodiment, the SP function generator 20 may be an arbitrary waveform generator (AWG).

A function generator such as SP function generator 20 may be a circuit that includes an electronic oscillator. More than one electronic oscillator may be included in a function generator. Waveforms may be generated by a function generator using digital signal processing. The digital output may then be converted with a digital-to-analog converter to produce an analog waveform. A function generator may also include modulation functions such as amplitude modulation, frequency modulation, or phase modulation.

The frequency of the superimposed waveform may be higher than the pulse modulation frequency. In various embodiments, the frequency of the superimposed waveform may be an RF frequency and is about 13.56 MHz in one embodiment. As a result, each of the resulting SP pulses may include several cycles of the superimposed waveform. The waveform shape may include a periodic waveform such as a sinusoidal wave, a square wave, a sawtooth wave, and the like. Alternatively, the waveform shape may include an aperiodic wave such as a superposition of multiple sinusoidal waves of various frequencies to generate an arbitrary waveform shape.

The SP control path 201 may include an optional SP impedance matching network 25. As a person of skill in the art may recognize, an impedance matching network, such as the SP impedance matching network 25, can be implemented using feedback control circuits that phase shift compensation signals based on an impedance measurement such as, for example, described in US Patent Publication 2009/0000942. The matching circuits may be variations of L and T type networks. For example, an impedance matching network may include a network of inductors, capacitors, and/or variable capacitors. Frequency tuning, i.e., adjustment of the driving frequency to match the antenna-plasma resonance is another means of matching. Frequency tuning in pulsed mode may utilize feedback control to take advantage of power or voltage measurements that correlate with plasma impedance.

The SP pulses generated by the SP function generator 20 may pass through the optional SP impedance matching network 25 before being coupled to the plasma processing chamber 210 by the SP coupling electrode 15. The optional SP impedance matching network 25 may be omitted in certain plasma processing systems such as when the SP coupling electrode 15 is a resonant structure inductively coupled to the plasma 60. Conversely, the optional SP impedance matching network 25 may be included when the SP coupling electrode 15 is non-resonant. The optional SP impedance matching network 25 may be used to ensure that the source power is efficiently coupled to the plasma 60 by matching the impedance of the load to the impedance of the supply.

Still referring to FIG. 2, the bias power may be coupled to the plasma processing chamber 210 using a BP control path 202. The BP control path 202 may be coupled to the SP control path 201 through a pulse modulation timing circuit 52. The pulse modulation timing circuit 52 may determine the timing of BP pulses relative to the timing of SP pulses generated by the SP control path 201. The pulse modulation timing circuit 52 may receive a signal from the SP pulse modulation circuit 51 and introduce a delay triggered by either the leading edge or the trailing edge of a SP pulse. The signal from the SP pulse modulation circuit 51 to the pulse modulation timing circuit 52 may be the SP pulse or a clock signal indicative of the SP pulse, as examples. Alternatively, the SP pulses and BP pulses may be offset from one another based on a timing schedule which may be implemented using clock signaling. As an example, if the leading edge bias offset parameter is set to 8% of the pulse modulation period, the pulse modulation timing circuit 52 may introduce a delay equal to 8% of the pulse modulation period after being triggered by the trailing edge of a SP pulse. Alternatively, if the pulse modulation timing circuit 52 is configured to be triggered by the leading edge of a SP pulse, a delay of 8% of the pulse modulation period plus the source power duty cycle (%) may be introduced by the pulse modulation timing circuit 52. As a further alternative, the pulse modulation timing circuit 52 may determine the timing of SP pulses relative to the timing of BP pulses generated by the BP control path 202.

As a person of skill in the art may recognize, a timing circuit, such as the pulse modulation timing circuit 52, can be implemented using any timing circuit. In one specific example, a Highland Technology T560 4-channel compact digital delay and pulse generator circuit may be used.

Similar to the SP control path 201, the BP control path 202 may include an optional BP pulse modulation circuit 53 triggered by the pulse modulation timing circuit 52. The optional BP pulse modulation circuit 53 may modulate a bias signal between a BP high amplitude state and a BP low amplitude state. For example, the modulated bias signal may correspond with the BP pulses 12 as described in reference to FIG. 1. Alternatively, the optional BP pulse modulation circuit 53 may be omitted and a delayed modulated source signal may correspond with the BP pulses.

The modulated bias signal may be received by an optional BP function generator 30. The optional BP function generator 30 may superimpose a waveform onto the modulated bias signal. The waveform may be similar or different than the waveform superimposed on the modulated source signal and may have any desired waveform shape as previously described. The optional BP function generator 30 may also optionally include an amplification circuit to increase the amplitude of the modulated bias signal. In one embodiment, the bias power delivered to the plasma processing chamber 210 is DC power. In this case, the optional BP function generator 30 may be omitted. In some cases where amplification is needed, but function generation is not, an amplification circuit may be included instead of the optional BP function generator 30.

A BP impedance matching network 35 is also included in the BP control path 202 between the optional BP function generator 30 and the BP coupling electrode 19. The BP impedance matching network may be used to ensure that the bias power is efficiently coupled to the plasma processing chamber 210 by matching the impedance of the load to the impedance of the supply.

The SP function generator 20 and the optional SP impedance matching network 25 may be included in a SP generator circuit 240 which receives source power and provides SP pulses to the SP coupling electrode 15. Similarly, the optional BP function generator 30 and the BP impedance matching network 35 may be included in a BP generator circuit 245 which receives bias power and provides BP pulses to the BP coupling electrode 19.

One or more of the elements described above may be included in a controller. For example, as shown in FIG. 2, the SP pulse modulation circuit 51, pulse modulation timing circuit 52, and optional BP pulse modulation circuit 53 may be included in a controller 250. The controller 250 may be locally located relative to the plasma processing chamber 210. Alternatively, controller 250 may be located remotely relative to the plasma processing chamber 210. The controller 250 may be capable of exchanging data with one or more of the elements included in the SP control path 201 and the BP control path 202. Each of the impedance matching networks may be controlled by controller 250 or may include a separate controller.

The controller 250 may be configured to set, monitor, and/or control various control parameters associated with generating a plasma and delivering ions to the surface of a microelectronic workpiece. Control parameters may include, but are not limited to power level, frequency, and duty cycle (%) for both the source power and the bias power as well as bias offset percentage. Other control parameter sets may also be used. For example, pulse width of the SP pulses and BP pulses and the bias offset may be entered directly rather than being represented as a duty cycle (%) of the pulse modulation period.

Figure 3:
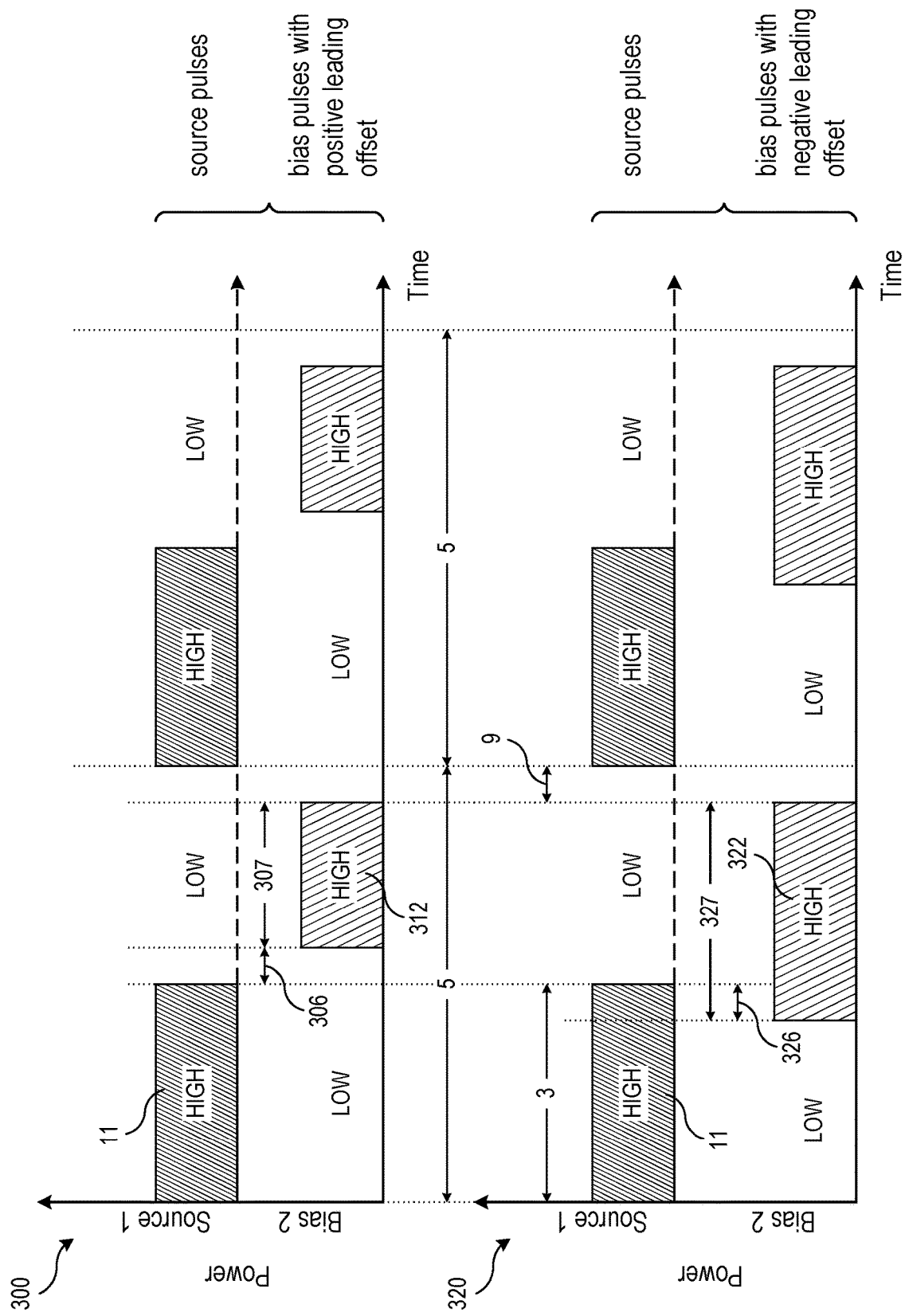
FIG. 3 illustrates schematic timing diagrams of example methods of plasma processing including bias pulses with positive and negative leading offsets relative to source pulses in a accordance with embodiments of the invention.

FIG. 3 illustrates schematic timing diagrams of example methods of plasma processing including bias pulses with positive and negative leading offsets relative to source pulses in accordance with embodiments of the invention. The timing diagrams of FIG. 3 may be specific implementations of other embodiment timing diagrams, such as timing diagram 100 of FIG. 1, for example. Similarly labeled elements may be as previously described.

Referring to FIG. 3, a timing diagram 300 includes a positive leading edge (+LE) bias offset 306 between high amplitude states of SP pulses 11 and high amplitude states of non-overlapping BP pulses 312 which do not overlap in time with adjacent SP pulses 11 in the pulse sequence. The non-overlapping BP pulses 312 also include a non-overlapping BP pulse width 307 and are separated from subsequent SP pulses 11 by a trailing edge bias offset 9.

In contrast, a timing diagram 320 is similar to timing diagram 300 except that timing diagram 320 includes a negative leading edge (−LE) bias offset 326 between high amplitude states of SP pulses 11 and high amplitude states of −LE BP pulses 322 which partially overlap in time with adjacent SP pulses 11 in the pulse sequence. For example, both the +LE bias offset 306 and the −LE bias offset 326 are measured relative to the trailing edge of a respective SP pulse 11. Consequently, a negative offset such as −LE bias offset 326 results in −LE BP pulses 322. The −LE BP pulses 322 also include an overlapping BP pulse width 327 and are separated from subsequent SP pulses 11 by a trailing edge bias offset 9.

Figure 4:
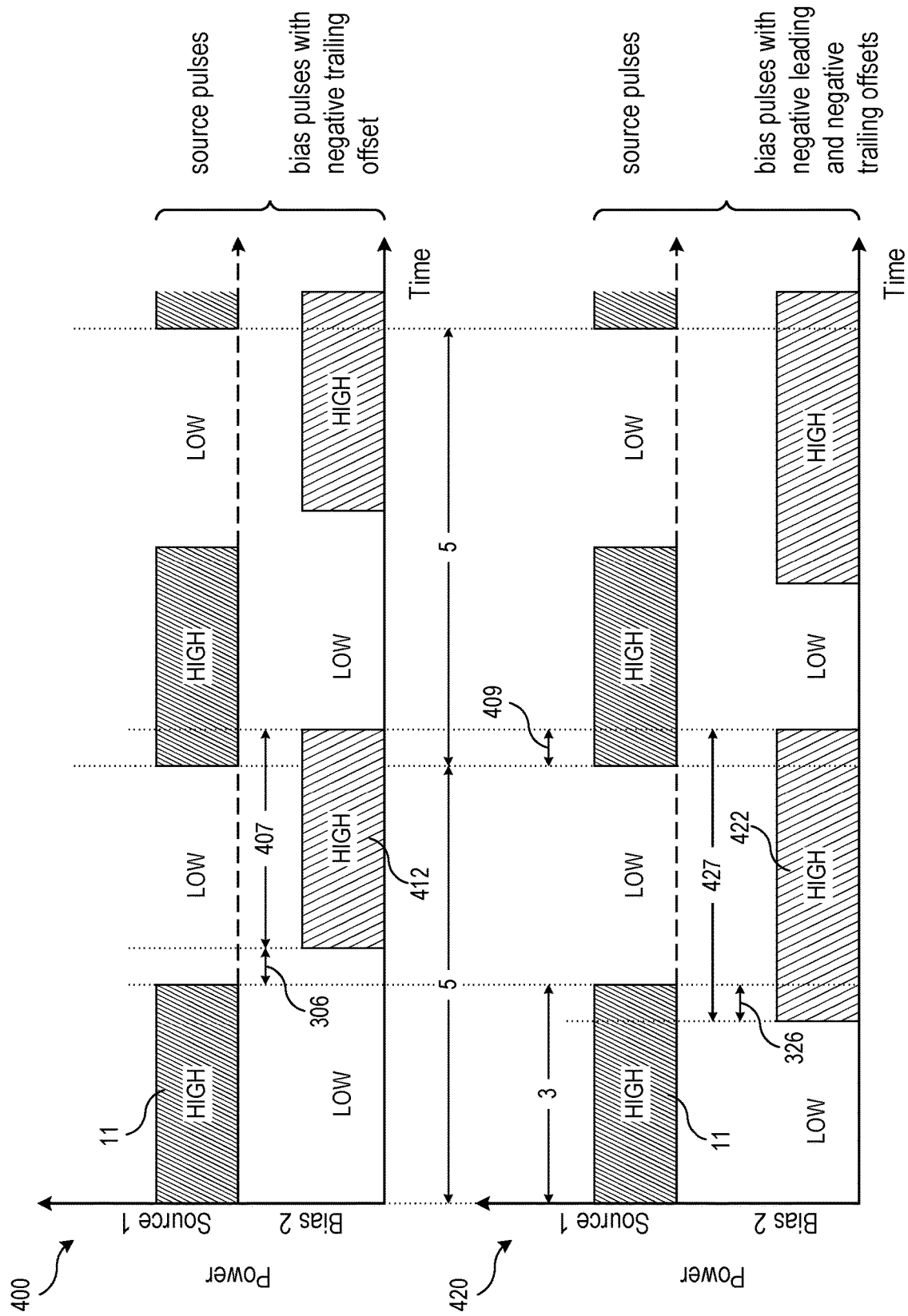
FIG. 4 illustrates schematic timing diagrams of example methods of plasma processing including bias pulses with negative and positive trailing offsets relative to source pulses in accordance with embodiments of the invention.

FIG. 4 illustrates schematic timing diagrams of example methods of plasma processing including bias pulses with negative and positive trailing offsets relative to source pulses in accordance with embodiments of the invention. The timing diagrams of FIG. 4 may be specific implementations of other embodiment timing diagrams, such as timing diagram 100 of FIG. 1, for example. Similarly labeled elements may be as previously described.

Referring to FIG. 4, a timing diagram 400 includes a negative trailing edge (−TE) bias offset 409 in addition to a +LE bias offset 306. Each resulting −TE BP pulse 412 of the pulse sequence has a −TE BP pulse width 407 and is non-overlapping in time with the previous SP pulse 11, but partially overlapping in time with the subsequent SP pulse 11. According to the convention adopted in this illustration for offsets, a negative offset value indicates overlap with an adjacent pulse. Therefore, for trailing edge offsets of a given pulse, a negative offset results in overlap between the trailing edge of the pulse and the leading edge of the next pulse, as illustrated for −TE bias offset 409 in timing diagram 400, for example.

Similarly, a timing diagram 420 includes a negative −TE bias offset 409 in addition to a −LE bias offset 326 between high amplitude states of SP pulses 11 and high amplitude states of overlapping BP pulses 422 which partially overlap with both the previous and subsequent SP pulses 11 of the pulse sequence. The overlapping BP pulses 11 include an overlapping BP pulse width 427 which is greater in duration than each SP pulse width 3 of the SP pulses 11.

Figure 5:
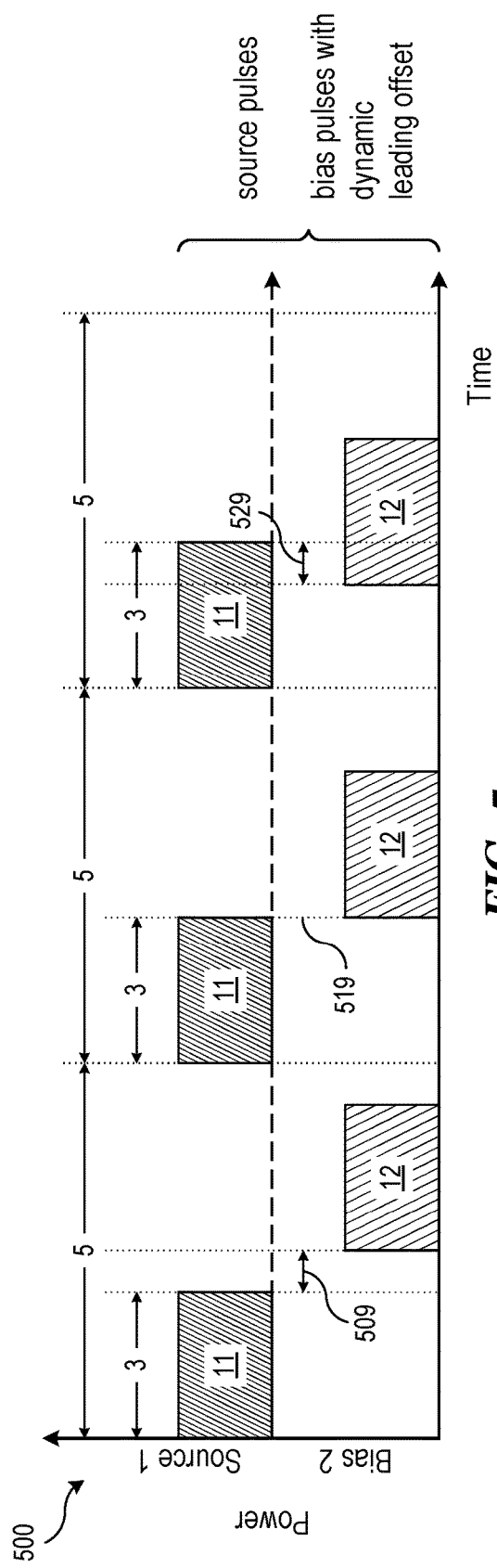
FIG. 5 illustrates a schematic timing diagram of an example method of plasma processing including bias pulses with dynamic offsets relative to source pulses in accordance with an embodiment of the invention.

FIG. 5 illustrates a schematic timing diagram of an example method of plasma processing including bias pulses with dynamic offsets relative to source pulses in accordance with an embodiment of the invention. The timing diagram of FIG. 5 may be a specific implementation of other embodiment timing diagrams, such as timing diagram 100 of FIG. 1, for example. Similarly labeled elements may be as previously described.

Referring to FIG. 5, a timing diagram 500 includes SP pulses 11 with pulse modulation period 5 and BP pulses 12 with variable leading offset bias offsets (509, 519, 529) that may be dynamically varied. Specifically, the leading edge bias offset of each of the BP pulses 12 may change for each SP pulse 11 of the pulse sequence. Any combination of positive, zero, and negative leading or trailing offsets are possible. For example, the first BP pulse 12 is illustrated with a positive variable offset 509, while the second and third BP pulses 12 are illustrated with a zero value variable offset 519 and a negative variable offset 529 respectively. It should be noted that while the offsets may change every pulse modulation period 5, they may also stay the same for multiple pulse modulation periods at a time or change gradually. For example, a large positive offset may gradually be decreased in magnitude from period to period until it becomes zero and then negative.

Figure 6:
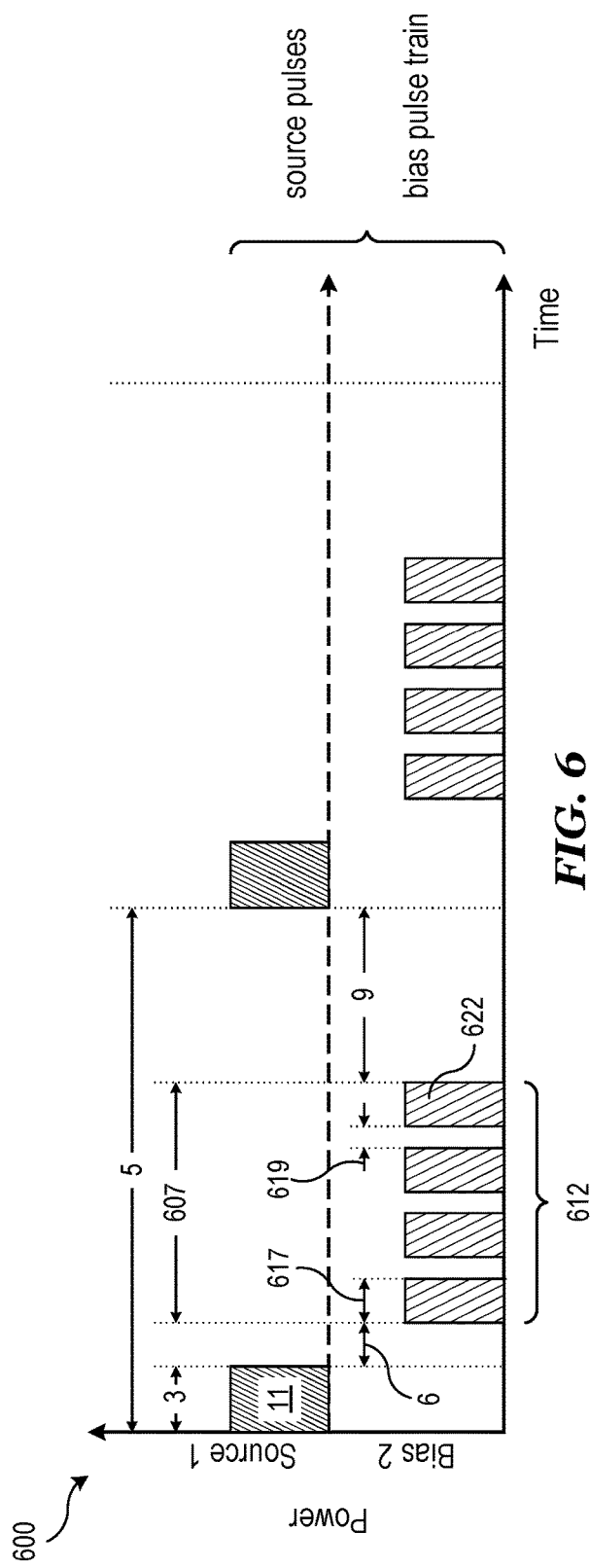
FIG. 6 illustrates a schematic timing diagram of an example method of plasma processing include bias power pulse trains in accordance with an embodiment of the invention.

FIG. 6 illustrates a schematic timing diagram of an example method of plasma processing include bias power pulse trains in accordance with an embodiment of the invention. The timing diagram of FIG. 6 may be a specific implementation of other embodiment timing diagrams, such as timing diagram 100 of FIG. 1, for example. Similarly labeled elements may be as previously described.

Referring to FIG. 6, a timing diagram 600 includes SP pulses 11 and BP pulse trains 612 with BP pulse train width 607. The BP pulse trains 612 may be specific embodiments of BP pulses 12 as previously described. The BP pulse trains 612 include BP subpulses 622 and corresponding BP subpulse width 617 and BP subpulse separation 619. Each of the BP subpulses 622 may be implemented similar to BP pulses 12. In various embodiments, the BP subpulses 622 are AC pulses and are RF pulses in one embodiment. In another embodiment, the BP subpulses 622 are DC pulses.

Figure 7:
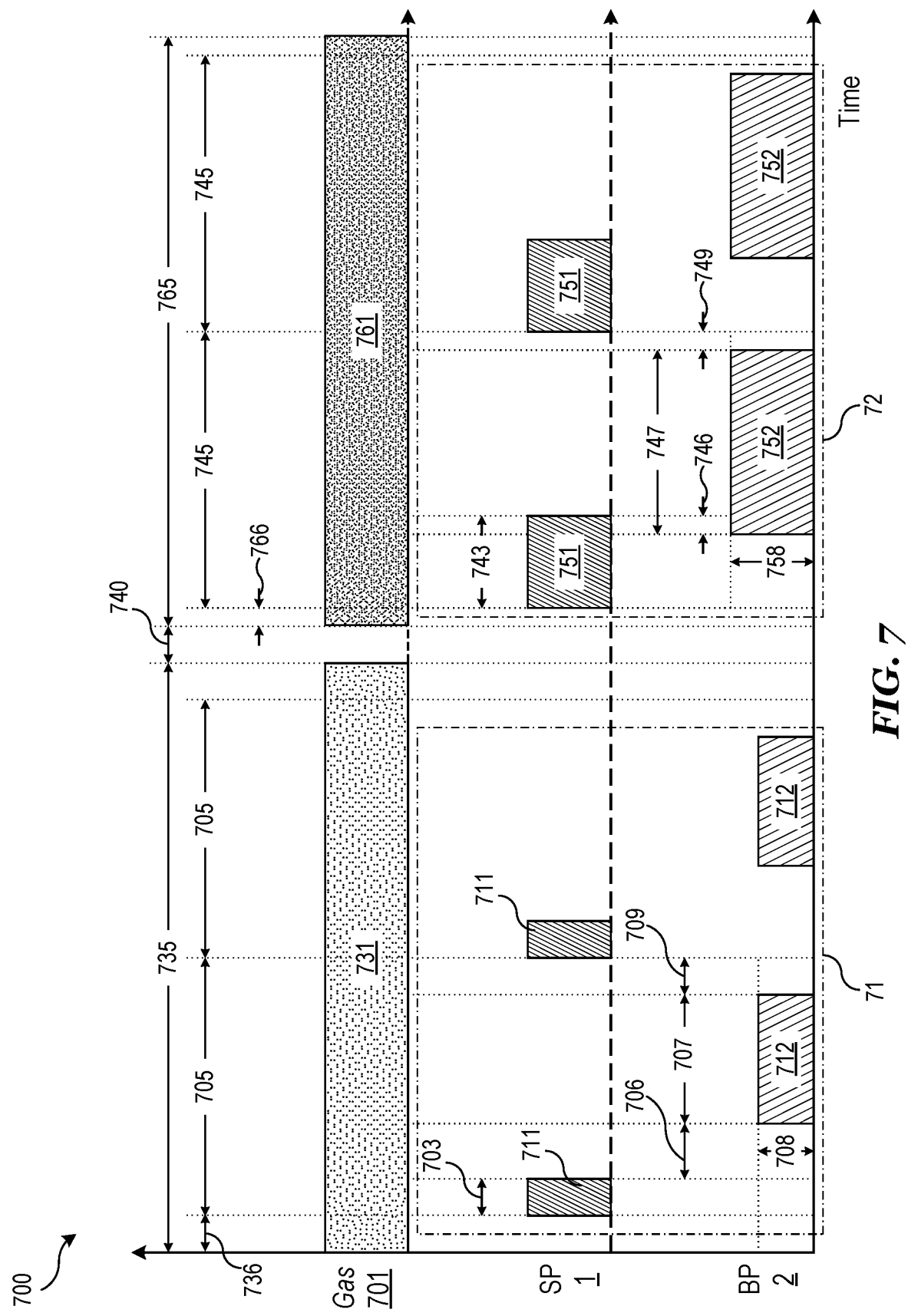
FIG. 7 illustrates a schematic timing diagram of an example method of plasma processing including source pulse and bias pulse timing associated with particular gas flows in accordance with an embodiment of the invention.

FIG. 7 illustrates a schematic timing diagram of an example method of plasma processing including source pulse and bias pulse timing associated with particular gas flows in accordance with an embodiment of the invention. The timing diagram of FIG. 7 may incorporate one or more specific implementations of other embodiment timing diagrams, such as timing diagram 100 of FIG. 1. For example, a given plasma process may utilize multiple types of gas, each of which may have a specific implementation of an embodiment timing diagram associated with it. Similarly labeled elements may be as previously described.

Referring to FIG. 7, a timing diagram 700 includes a gas source 701 in addition to a source power 1 and a bias power 2. The gas source 701 may include multiple gases and/or mixtures of gases. For example, as illustrated in timing diagram 700, gas source 701 includes a first gas (G1) flow 731 with a G1 gas flow duration 735 and a second gas (G2) flow 761 with a G2 gas flow duration 765. The G1 gas flow 731 and the G2 gas flow 761 are separated in time by a gas flow offset 740. Alternatively, the second gas may be introduced during the G1 gas flow 731 and the G2 gas flow 761 may partially overlap with the G2 gas flow 731.

Each of the gases may have a pulse sequence associated with the respective gas flow duration. Specifically, a set of plasma processing parameters may be chosen for each gas, for example, from prior embodiments such as in FIGS. 1, and 3-6, to generate a pulse sequence that is specifically tailored for a particular gas while it is being provided to the plasma processing chamber.

As illustrated in timing diagram 700, the G1 pulse sequence 71 associated with the G1 gas flow 731 includes G1 SP pulses 711 with G1 SP pulse width 703 and G1 BP pulses 712 with G1 BP pulse width 707 and G1 BP pulse amplitude 708. The G1 BP pulses 712 are temporally defined relative to the G1 SP pulses 711 by a G1 LE bias offset 706 and a G1 TE bias offset 709. The G1 pulse sequence 71 has a G1 pulse modulation period 705 and may be offset from the leading edge of the G1 gas flow 731 by a G1 LE source offset 736.

Similarly, the G2 gas flow 761 has an associated G2 pulse sequence 72 including G2 SP pulses 751 with G2 SP pulse width 743 and G2 BP pulses 752 with G2 BP pulse width 747 and G2 BP pulse amplitude 758. The G2 BP pulses 752 are temporally defined relative to the G2 SP pulses 751 by a G2 LE bias offset 746 and a G2 TE bias offset 749. The G2 pulse sequence 72 has a G2 pulse modulation period 745 and may be offset from the leading edge of the G2 gas flow 761 by a G2 LE source offset 766. As illustrated, plasma processing parameters may be different between gas flows. For example, pulse width, pulse amplitude, frequency, offset, and others for both source power and bias power may be varied along with the gas flow.

Figure 8:
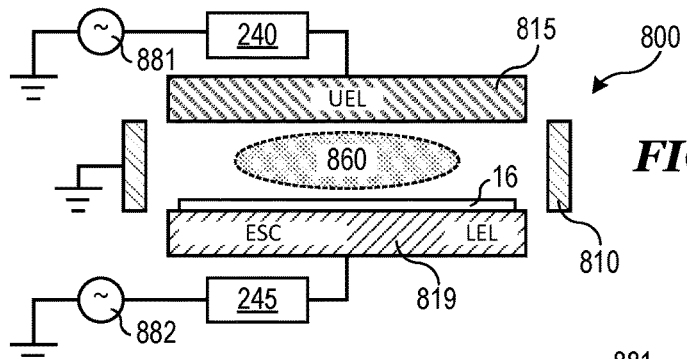
FIG. 8 illustrates a schematic diagram of an example capacitively coupled plasma processing system which may be used to perform methods of plasma processing in accordance with an embodiment of the invention.
Figure 9:
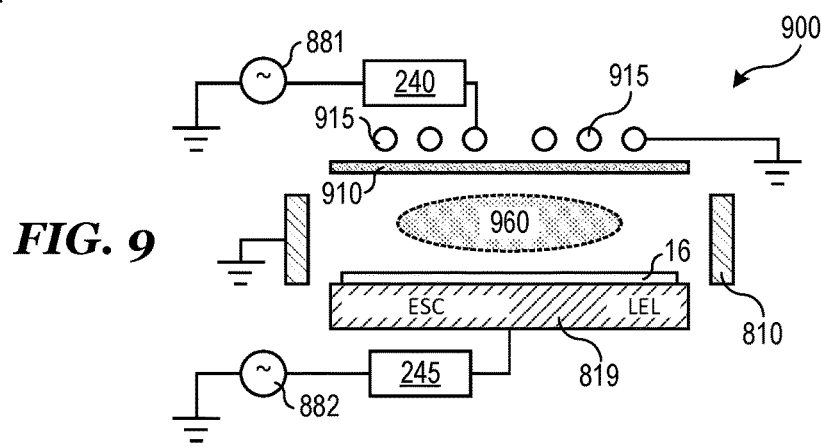
FIG. 9 illustrates a schematic diagram of an example inductively coupled plasma processing system which may be used to perform methods of plasma processing in accordance with an embodiment of the invention.
Figure 10:
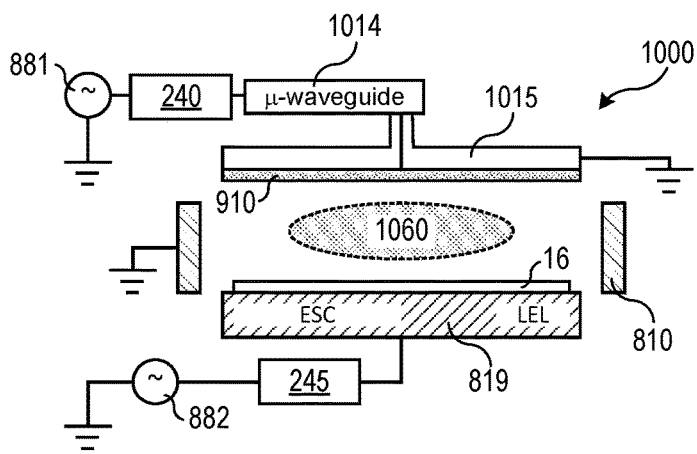
FIG. 10 illustrates a schematic diagram of an example surface wave plasma processing system which may be used to perform methods of plasma processing in accordance with an embodiment of the invention.
Figure 11:
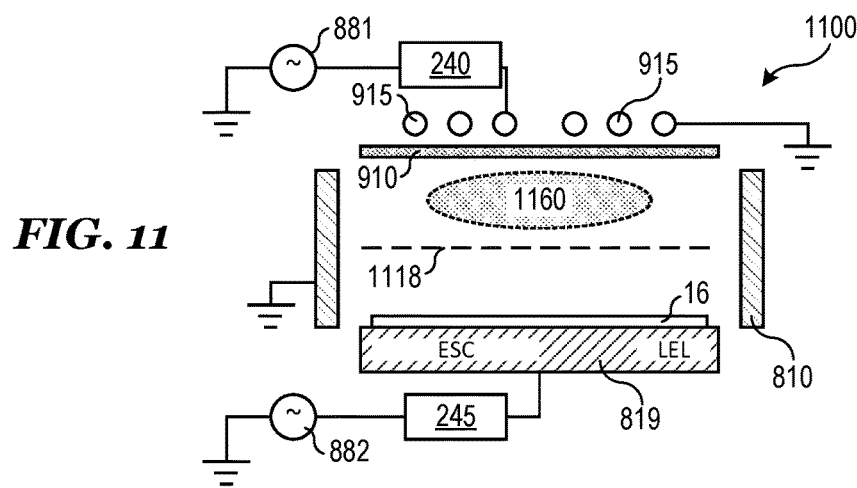
FIG. 11 illustrates a schematic diagram of an example remote plasma processing system which may be used to perform methods of plasma processing in accordance with an embodiment of the invention.

The embodiments described herein, where SP pulses and BP pulses are coupled to plasma, can be implemented by various apparatus, such as those depicted in FIGS. 8-11. FIG. 8 illustrates a schematic diagram of an example capacitively coupled plasma processing system, FIG. 9 illustrates a schematic diagram of an example inductively coupled plasma processing system, FIG. to illustrates a schematic diagram of an example surface wave plasma processing system, and FIG. 11 illustrates a schematic diagram of an example remote plasma processing system which may be used to perform methods of plasma processing in accordance with embodiments of the invention. The plasma processing systems of FIGS. 8-11 may each be a specific implementation of other embodiment plasma processing systems, such as the plasma processing system 200 of FIG. 2, for example. Similarly labeled elements may be as previously described.

Referring to FIG. 8, a capacitively coupled plasma (CCP) processing system 800 includes an AC source power supply 881 coupled to a SP generator circuit 240 that is coupled to an upper plate electrode (UEL) 815 and an AC bias power supply 882 coupled to a BP generator circuit 245 that is coupled to a lower plate electrode (LEL) 819. The AC source power supply 881 and the AC bias power supply 882 may respectively generate source power and bias power in accordance with the embodiments described previously such as in FIGS. 1, 3-7. A CCP 860 is formed within a grounded plasma processing chamber 810 proximate a substrate 16 between the UEL 815 and the LEL 819. The LEL 819 may also serve as an electrostatic chuck (ESC) to support and retain the substrate 16. In various embodiments, plasma is formed by coupling RF power to at least one of the electrodes. The AC power coupled to the UEL 815 may have a different RF frequency than the AC power coupled to LEL 819. Alternatively, multiple RF power sources may be coupled to the same electrode. Moreover, direct current (DC) power may be coupled to the upper electrode and/or the lower electrode.

Referring to FIG. 9, an inductively coupled plasma (ICP) processing system goo includes AC source power supply 881 coupled to a SP generator circuit 240 that is coupled to an inductive electrode 915 and AC bias power supply 882 coupled to a BP generator circuit 245 that is coupled to an LEL 819. Again, the AC source power supply 881 and the AC bias power supply 882 may respectively generate source power and bias power in accordance with the embodiments described previously such as in FIGS. 1, 3-7. An ICP 960 is formed proximate a substrate 16 between the inductive electrode 915 (e.g., a planar, or solenoidal/helical coil or antenna) and the LEL 819. A dielectric material 910 separates the inductive electrode 915 from the ICP 960. The dielectric material 910 may reduce and/or prevent capacitive coupling effects.

Referring to FIG. to, a surface wave plasma (SWP) processing system 1000 includes AC source power supply 881 coupled to a SP generator circuit 240 that is coupled to a microwave waveguide (μ-waveguide) 1014 and a slot antenna 1015. Similarly, the AC source power supply 881 and the AC bias power supply 882 may respectively generate source power and bias power in accordance with the embodiments described previously such as in FIGS. 1, and 3-7. An SWP 1060 is formed proximate a substrate 16 between the slot antenna 1015 and a LEL 819. The SWP 1060 is formed by coupling RF power at microwave frequencies through a coaxial line and the μ-waveguide 1014 to the slot antenna 1015. (PV-perhaps a small detail on FIG. 10 but The slot antenna 1015 may be implemented as a plate with holes or other structures. In some embodiments, the slot antenna may be sandwiched between dielectric structures similar to dielectric material 910 of FIG. 9 so that microwaves may pass from the waveguide (center) radially outward from the center (e.g., through a ceramic structure with a dielectric constant such that the wavelength is reduced, through the antenna structures, and/or through another dielectric material).

Referring to FIG. 11, a remote plasma processing system 1100 is similar to the ICP processing system 900 of FIG. 9 except that instead of a plasma being formed proximate a substrate, a remote plasma 1160 is formed in a region remote from a substrate 16, for example, in a different plasma chamber or an isolated part of the plasma processing chamber 810. The remote plasma 1160 is separated or isolated from the substrate 16 by a particle isolation structure 1118. The particle isolation structure 1118 may be a filter, conduit, or orifice plate arranged to impede the transport of charged particles from the remote plasma source to the substrate 16. In one embodiment, the remote plasma 1160 is an ICP. Alternatively, the remote plasma 1160 may be a CCP, an SWP, etc.

Figure 12:
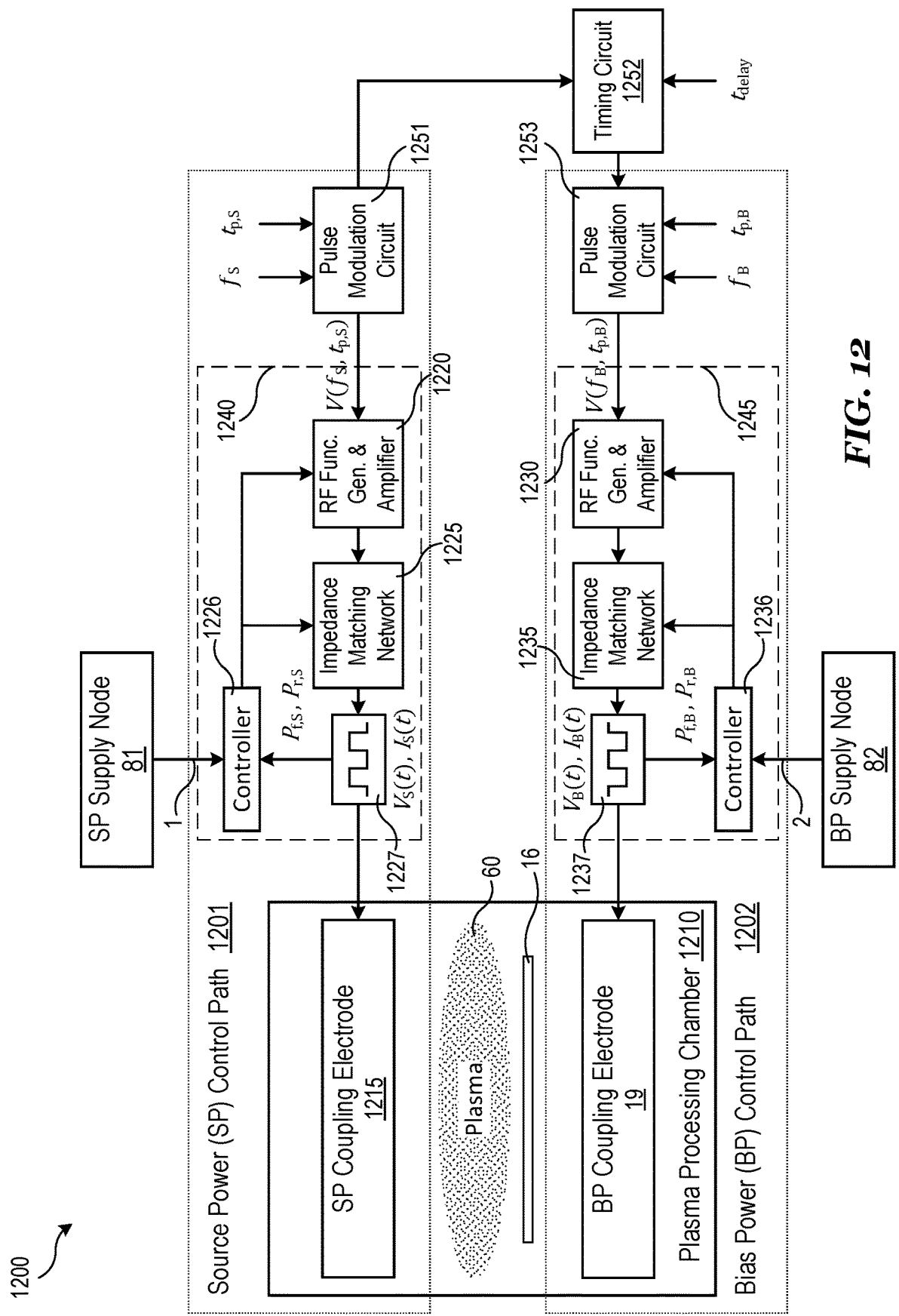
FIG. 12 illustrates a block diagram of an example plasma processing system including a non-resonant source power coupling electrode in accordance with an embodiment of the invention.

FIG. 12 illustrates a block diagram of an example plasma processing system including a non-resonant source power coupling electrode in accordance with an embodiment of the invention. The plasma processing system of FIG. 12 may be used to perform any of the embodiment methods as described herein, such as the method of FIG. 1, for example.

Referring to FIG. 12, a non-resonant plasma processing system 1200 includes a SP supply node 81 supplying source power 1 coupled to an non-resonant SP coupling electrode 1215 of a plasma processing chamber 1210 and a BP supply node 82 supplying bias power 2 coupled to a bias power coupling electrode 19 of the plasma processing chamber 1210. The source power 1 is coupled to the non-resonant SP coupling electrode 1215 through a SP control path 1201 which includes a SP controller 1226 configured to control source power settings. For example, the SP controller 1226 may adjust gain settings for a SP RF function generator and amplifier 1220 and impedance matching settings for a SP impedance matching network 1225. Similarly, the bias power 2 is coupled to BP coupling electrode 19 through a BP control path 1202 including a BP controller 1236 which controls bias settings of a BP RF function generator and amplifier 1230 and a BP impedance matching network 1235.

Since the non-resonant plasma processing system 1200 couples source power 1 using a non-resonant structure, the SP impedance matching network 1225 is included in order to efficiently provide source power to a plasma. In order for maximum power to be transferred from the non-resonant SP coupling electrode 1215 to the plasma, the impedance of the load on the power supply should be the same as the impedance of the power supply itself. For example, the impedance of the load on the power supply may be influenced by the impedance of the plasma, which may depend on specific rapidly changing conditions such as chemistry, pressure, density, and others. Therefore, the SP impedance matching network 1225 may beneficially allow plasma conditions to vary while maintaining efficient power coupling of the source power 1 to the plasma 60.

A SP pulse signal is generated using a SP pulse modulation circuit 1251 which may receive one or more plasma processing parameters as inputs. For example, as illustrated, the SP pulse modulation circuit 1251 receives a SP pulse frequency $f_S$ and a SP pulse width $t_{p,S}$. The SP pulse modulation circuit 1251 then generates a SP pulse signal $V(f_S, t_{p,S})$ using $f_S$ and $t_{p,S}$. In one embodiment, the SP pulse signal $V(f_S, t_{p,S})$ includes a high amplitude state of about 5 V and a low amplitude state of about 0 V. However, other voltage levels are also possible. The SP pulse frequency $f_S$ can range from about 0.1 Hz to about 10 kHz. Alternatively, the SP pulse frequency $f_S$ can range from about 1 kHz to about 5 kHz.

The SP RF function generator and amplifier 1220 receives the source power 1 from the SP supply node 81 and the SP pulse signal $V(f_S, t_{p,S})$ from the SP pulse modulation circuit 1251 and then generates SP pulses by amplifying and modulating the SP pulse signal $V(f_S, t_{p,S})$ with a function. The power amplification may range from a few watts (e.g., 1-2 W) to greater than 1000 kW. In one embodiment, the generated function may comprise an AC signal. The AC signal can be generated at a source frequency, which can fall within the RF range, very-high frequency (VHF) range, or microwave (MW) range of the electromagnetic spectrum. Alternatively, the generated function may comprise a DC signal such as a pulsed DC signal.

The SP pulses pass through the SP impedance matching network 1225 and to a SP directional coupler 1227. Therefore, the SP directional coupler 1227 receives SP pulses with a time varying source voltage $V_S(t)$ and source current $I_S(t)$. The SP directional coupler 1227 is configured to pass the SP pulses to the non-resonant SP coupling electrode 1215. The SP directional coupler 1227 is also coupled to the SP controller 1226 which may beneficially allow the SP controller 1226 to adjust source power settings based on a comparison of the forward source power $P_{f,S}$ and the reverse source power $P_{r,S}$, as illustrated. For example, the forward source power $P_{f,S}$ may be an indication of the magnitude of the power being transmitted in a forward direction (i.e., toward the SP coupling electrode) while the reverse source power $P_{r,S}$ may be an indication of the magnitude of the power being reflected in a reverse direction (i.e., away from the SP coupling electrode). $P_{f,S}$ and $P_{r,S}$ may be measured by the SP controller 1226.

A similar feedback mechanism may be implemented between the BP controller 1236 and a BP directional coupler 1237 that receives time varying bias voltage $V_B(t)$ and bias current $I_B(t)$ so that bias power settings may be adjusted based on a comparison of the forward bias power $P_{f,B}$ and the reverse bias power $P_{r,B}$, which may be an indication of the magnitudes of the power being transmitted in a forward direction (i.e., toward the BP coupling electrode) and the power being reflected in a reverse direction (i.e., away from the BP coupling electrode). $P_{f,B}$ and $P_{r,B}$ may be measured by the BP controller 1236.

The SP RF function generator and amplifier 1220, the SP impedance matching network 1225, the SP controller 1226, and the SP directional coupler 1227 are included in a non-resonant SP generator circuit 1240 which receives the source power 1 from the SP supply node 81 and provides SP pulses to the non-resonant SP coupling electrode 1215. The non-resonant SP generator circuit 1240 may be a specific implementation of the SP generator circuit 240 of FIG. 2, for example. Similarly, the BP RF function generator and amplifier 1230, the BP impedance matching network 1235, the BP controller 1236, and the BP directional coupler 1237 are included in a BP generator circuit 1245 which receives the bias power 2 from the BP supply node 82 and provides BP pulses to the BP coupling electrode 19. The BP generator circuit 1245 may be a specific implementation of the BP generator circuit 245 of FIG. 2, for example.

A time delay $t_{delay}$ is introduced between the SP pulses and BP pulses using a BP $t_{delay}$ timing circuit 1252 coupled to an output of the SP pulse modulation circuit 1251. The SP pulse modulation circuit 1251 may transmit a signal to the BP $t_{delay}$ timing circuit 1252, where the signal may be the SP pulse or a clock signal indicative of the SP pulse. The BP $t_{delay}$ timing circuit 1252 receives the time delay $t_{delay}$ at an input and then sends a signal to the BP pulse modulation circuit 1253. In one embodiment, the BP $t_{delay}$ timing circuit 1252 is triggered by the trailing edge of the SP pulse signal. Alternatively, the BP $t_{delay}$ timing circuit 1252 may be triggered by the leading edge of the SP pulse signal. The BP pulse modulation circuit 1253 generates a BP pulse signal using inputs (e.g., BP pulse frequency $f_B$ and BP pulse width $t_{p,B}$) which is then sent to the BP RF function generator and amplifier 1230.

When different gases are pulsed, an alternating time delay may be used. For example, a specific time delay may correspond to each gas or combination of gases during a given plasma process. Further, other plasma processing parameters may change for a particular gas or combination of gases such as the SP pulse frequency $f_{S}S$, the SP pulse width $t_{p,S}$, the BP pulse frequency $f_B$, the BP pulse width $t_{p,B}$, and others.

The function generated by the BP RF function generator and amplifier 1230 may comprise an AC signal. The AC signal can be generated at a bias frequency, which can also fall within the RF range, VHF range, or MW range. For example, the source frequency can exceed about 10 MHz, and the bias frequency can be less than about 15 MHz. Alternatively, for example, the source frequency can exceed about 50 MHz, and the bias frequency can be less than about 5 MHz. Alternatively yet, the source frequency can range from about 50 MHz to about 150 MHz, and the bias frequency can range from about 1 MHz to about 5 MHz.

Figure 13:
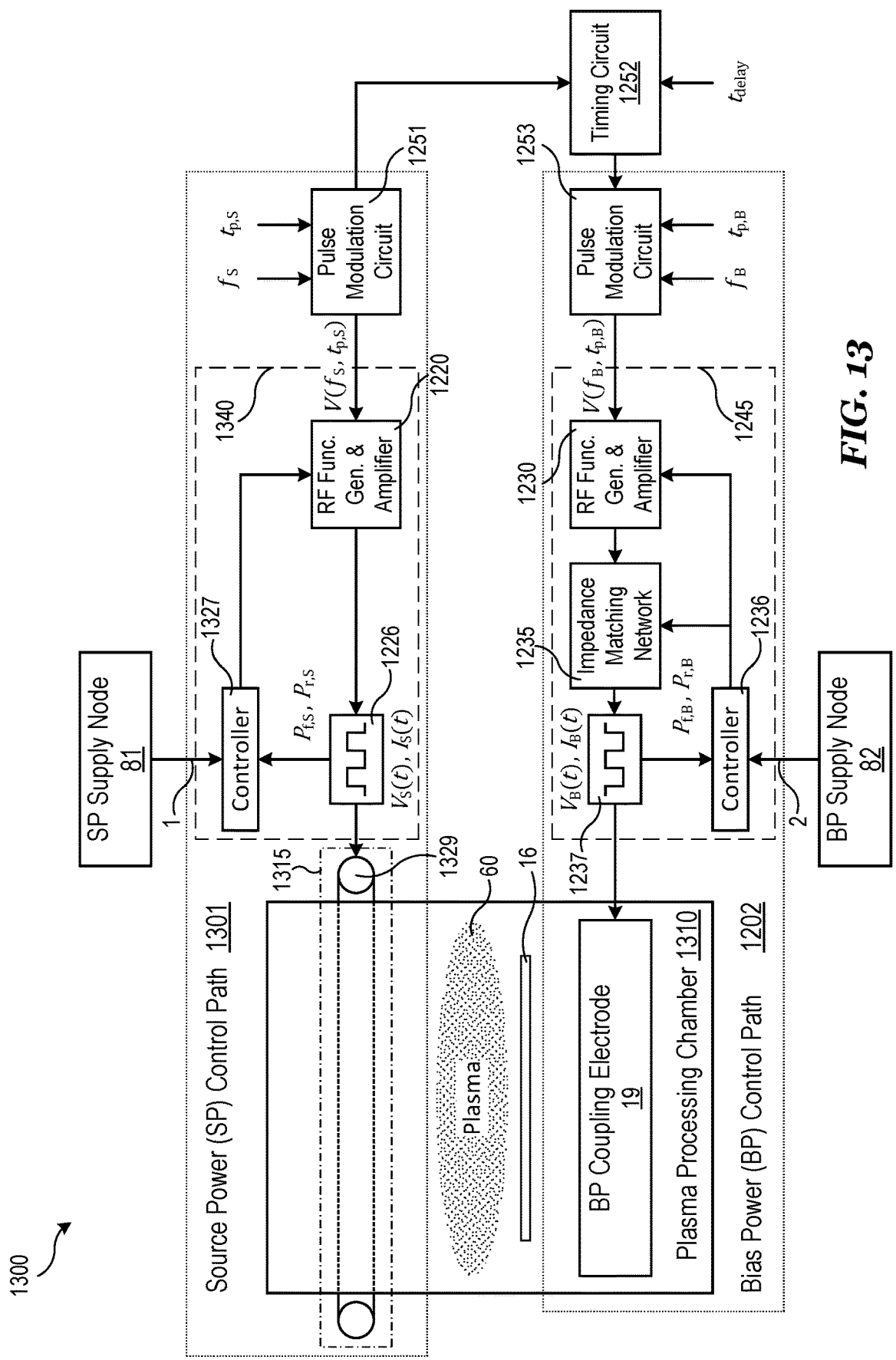
FIG. 13 illustrates a block diagram of an example plasma processing system including a resonant source power coupling electrode in accordance with an embodiment of the invention.

FIG. 13 illustrates a block diagram of an example plasma processing system including a resonant source power coupling electrode in accordance with an embodiment of the invention. The plasma processing system of FIG. 13 may be used to perform any of the embodiment methods as described herein, such as the method of FIG. 1, for example.

Referring to FIG. 13, a resonant plasma processing system 1300 includes a SP control path 1301 which includes a resonant SP coupling electrode 1315. The resonant plasma processing system 1300 is similar the non-resonant plasma processing system 1200 except that the SP impedance matching network 1225 is omitted in the SP control path 1301 because the resonant SP coupling electrode 1315 may provide the advantage of efficient source power coupling to a plasma 60 without impedance matching. Accordingly, a SP RF function generator and amplifier 1220 provides SP pulses directly to a SP directional coupler 1227 which may provide feedback to a SP controller 1327. The SP RF function generator and amplifier 1220, the SP controller 1226, and the SP directional coupler 1227 are included in a resonant SP generator circuit 1340 which receives the source power 1 from the SP supply node 81 and provides SP pulses to the resonant SP coupling electrode 1315. The resonant SP generator circuit 1340 may be a specific implementation of the SP generator circuit 240 of FIG. 2, for example.

The resonant plasma processing system 1300 may also advantageously enable agile pulsing of the source power. For example, impedance matching networks may be unable to respond as quickly as a matchless resonant structure such as the resonant SP coupling electrode 1315. Therefore, at higher SP pulse frequencies, impedance matching networks may be limited to lower frequencies in order to provide efficient source power to the plasma. In various embodiments, the resonant SP coupling electrode 1315 comprises a helical resonator antenna 1329.

Figure 14:
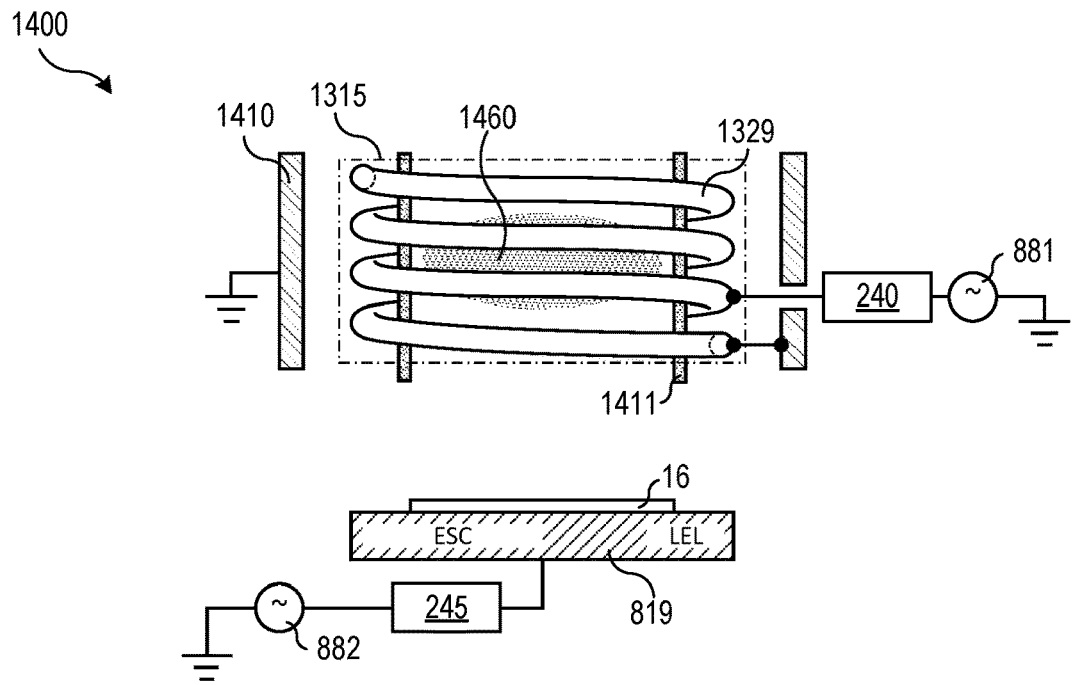
FIG. 14 illustrates a schematic diagram of an example helical resonator plasma processing system in accordance with an embodiment of the invention.

FIG. 14 illustrates a schematic diagram of an example helical resonator plasma processing system in accordance with an embodiment of the invention. The helical resonator plasma processing system may be a specific implementation of other plasma processing systems such as the plasma processing system 200 of FIG. 2, the ICP processing system 900 of FIG. 9 and/or the resonant plasma processing system 1300 of FIG. 13, as examples. Specifically, the source power coupling electrode is formed as a helical resonator antenna. Similarly labeled elements may be as previously described.

Referring to FIG. 14, a helical resonator plasma processing system 1400 includes a grounded outer structure 1410 surrounding a resonant SP coupling electrode 1315 implemented as a helical resonator antenna 1329 which in turn surrounds a dielectric inner surface 1411. The helical resonator antenna 1329 is grounded at one end and left free at the other. An AC source power supply 881 is coupled to a SP generator circuit 240 which is coupled to the helical resonator antenna 1329 at an appropriate distance from the grounded connection. The source power coupling location (also referred to as a tap position) may depend on operating frequency as well as other considerations. A helical resonator plasma 1460 is generated which is inductively coupled to the resonant SP coupling electrode 1315. For example, the dielectric inner surface 1411 may be provided between the helical resonator plasma 1460 and the helical resonator antenna 1329 to facilitate inductive coupling. An AC bias power supply 882 may be coupled to a BP generator circuit 245 which is coupled to a lower plate electrode (LEL) 819. The lower plate electrode (LEL) 819 serves as an electrostatic chuck (ESC) to support and retain a substrate 16.

The helical resonator antenna 1329 may be a full-wave, half-wave, or quarter-wave antenna. For example, if the helical resonator antenna 1329 is driven at using RF power with a frequency of 13.56 MHz, a quarter-wave helical resonator antenna may be about 5.5 m in length. As the RF frequency increases, the length of the helical resonator antenna 1329 may decrease. For example, a quarter-wave helical resonator antenna driven at about 50 MHz may be about 1.5 m in length.

Figure 15:
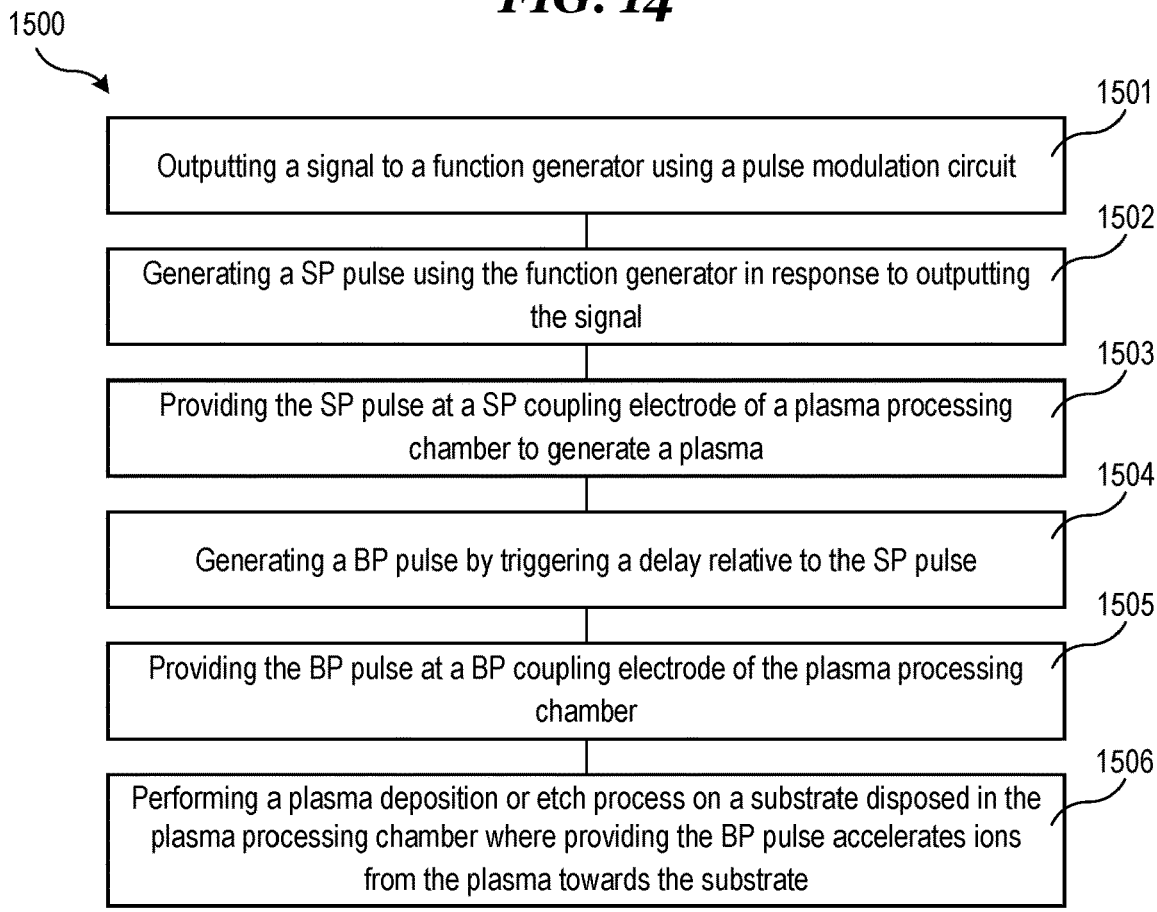
FIG. 15 illustrates an example method of plasma processing in accordance with an embodiment of the invention.
Figure 16:
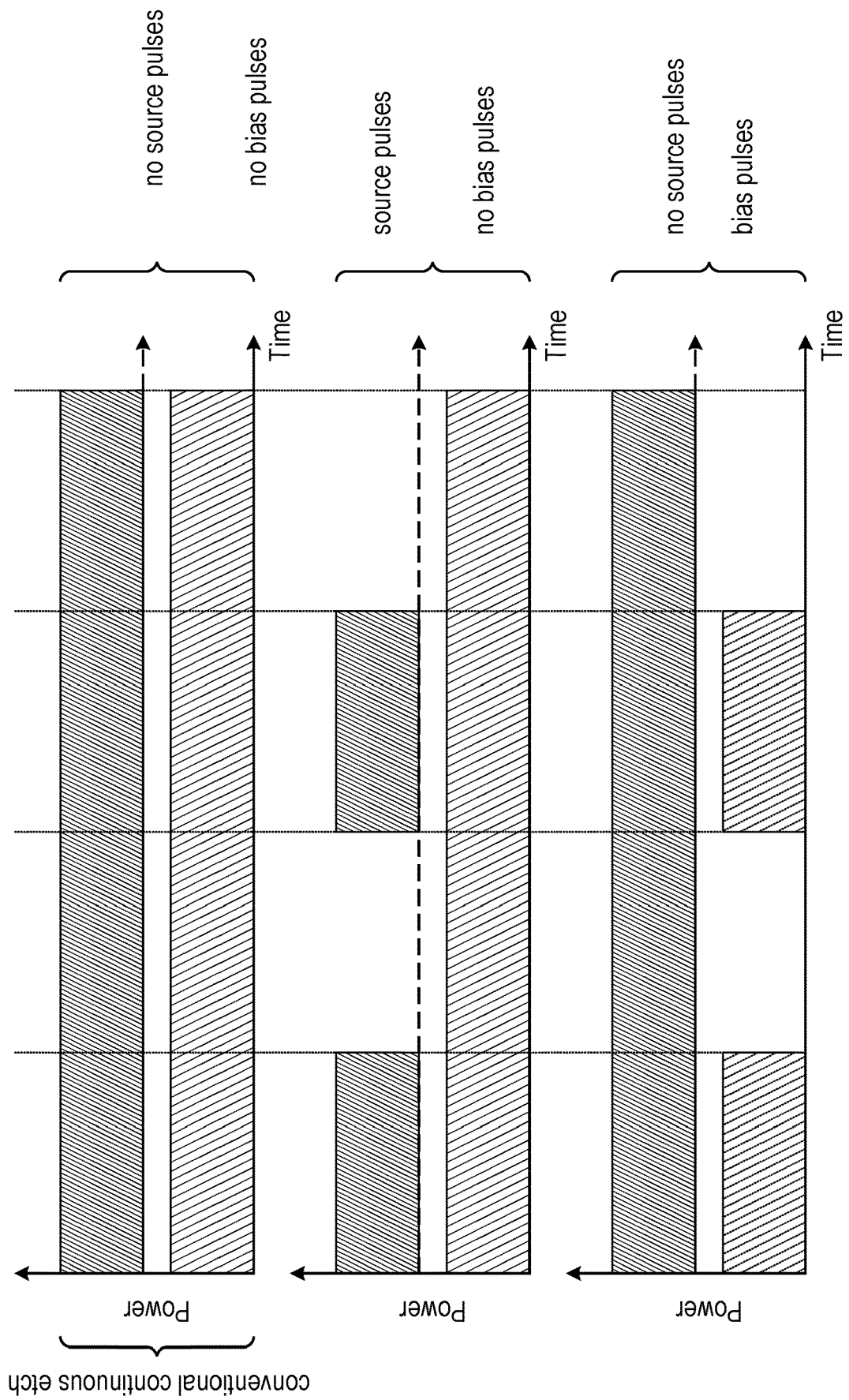
FIG. 16 illustrates several conventional timing diagrams including source power and bias power.

FIG. 15 illustrates an example method of plasma processing in accordance with an embodiment of the invention. The method of FIG. 15 may be performed by any of the embodiment plasma processing systems as described herein, such as plasma processing system 200 of FIG. 2, for example. It is noted that FIG. 15 is not intended to limit method steps to a particular order. Additionally, any of the steps as described in FIG. 15 may be performed concurrently in any combination as well as separately. Accordingly, variation of the ordering and/or timing of the below method steps is within the scope of the method as described as may be apparent to a person of skill in the art.

Step 1501 of a method 1500 of plasma processing includes outputting a signal to a function generator using a pulse modulation circuit. Step 1502 includes generating a SP pulse using the function generator in response to outputting the signal. Step 1503 includes providing the SP pulse at a SP coupling electrode of a plasma processing chamber to generate a plasma. Step 1504 includes generating a BP pulse by triggering a delay relative to the SP pulse. Step 1505 includes providing the BP pulse at a BP coupling electrode of the plasma processing chamber. Step 1506 includes performing a plasma deposition or etch process on a substrate disposed in the plasma processing chamber where providing the BP pulse accelerates ions from the plasma towards the substrate.

Example embodiments of the invention are summarized here. Other embodiments can also be understood from the entirety of the specification as well as the claims filed herein.

Example 1

A plasma processing system including a vacuum chamber; a first coupling electrode configured to provide power for generation of a plasma in the vacuum chamber, the first coupling electrode being further configured to couple SP pulses to the plasma; a substrate holder disposed in the vacuum chamber, the substrate holder being configured to support a substrate; a second coupling electrode configured to couple BP pulses to the substrate; and a controller configured to control a first offset duration between the SP pulses the BP pulses.

Example 2

The plasma processing system of example 1, wherein the first coupling electrode is capacitively coupled to the plasma, wherein the plasma processing system includes a capacitively coupled plasma processing system; or the first coupling electrode is inductively coupled to the plasma, wherein the plasma processing system includes a inductively coupled plasma processing system; or wherein the first coupling electrode is coupled to the plasma through a microwave waveguide and slot antenna, wherein the plasma processing system includes a surface wave plasma processing system.

Example 3

The plasma processing system of one of examples 1 and 2, further including a first function generator configured to generate the SP pulse, wherein the controller includes a timing circuit configured to generate the first offset duration; and a first pulse modulation circuit including a first output coupled to an input of the first function generator and a second output coupled to the timing circuit.

Example 4

The plasma processing system of example 3, further including a second pulse modulation circuit coupled to the timing circuit; and a second function generator coupled to the second pulse modulation circuit and configured to generate the BP pulses.

Example 5

The plasma processing system of one of examples 3 and 4, wherein the timing circuit is further configured to control a second offset duration between the BP pulses and the SP pulses.

Example 6

The plasma processing system of one of examples 3 to 5, wherein the first pulse modulation circuit includes a first input configured to receive a first pulse frequency, and a second input configured to receive a first pulse width, and wherein the first pulse modulation circuit is further configured to generate a SP pulse signal at an output based on the first pulse frequency and the first pulse width.

Example 7

The plasma processing system of one of examples 3 to 6, wherein the timing circuit includes a timing circuit input configured to receive a time delay, and wherein the timing circuit is further configured to set the first offset duration based on the time delay.

Example 8

The plasma processing system of one of examples 3 to 7, wherein the first function generator is configured to generate the SP pulses by modulating a SP pulse signal received from the first pulse modulation circuit with an alternating current (AC) signal generated at a first frequency.

Example 9

The plasma processing system of example 8, further including a second pulse modulation circuit coupled to the timing circuit and configured to generate a BP pulse signal; and a second function generator coupled to the second pulse modulation circuit and configured to generate the BP pulses by modulating the BP pulse signal with an AC signal generated at a second frequency, wherein the second frequency is less than about 15 MHz, and wherein the first frequency is greater than about 10 MHz.

Example 10

An apparatus including a vacuum chamber; a coupling electrode coupled to a source power (SP) supply node and configured to generate a plasma within the vacuum chamber using a first sequence of SP pulses; and a substrate holder coupled to a bias power (BP) supply node and disposed within the vacuum chamber, the substrate holder being configured to support a substrate to be processed by the plasma, wherein a second sequence of BP pulses is configured to accelerate ions of the plasma towards the substrate.

Example 11

The apparatus of example to, wherein the first SP pulse and the BP pulse are at least partially non-overlapping in time.

Example 12

The apparatus of one of examples 10 and 11, wherein the coupling electrode is a resonant coupling electrode.

Example 13

The apparatus of example 12, further including a function generator; and a directional coupler including an output directly coupled to the resonant coupling electrode and an input directly coupled to the function generator.

Example 14

The apparatus of one of examples 12 and 13, wherein the resonant coupling electrode is a helical resonator antenna.

Example 15

The apparatus of example to, further including a function generator; an impedance matching network coupled to the function generator; and a directional coupler including an input coupled to the impedance matching network, wherein the coupling electrode is a non-resonant coupling electrode, and wherein the directional coupler further includes an output coupled to the non-resonant coupling electrode.

Example 16

A method of plasma processing including using a first pulse modulation circuit, outputting a first signal to a first function generator; generating a first source power (SP) pulse using the first function generator in response to the outputting the first signal; providing the first SP pulse at a first coupling electrode of a vacuum chamber to generate a plasma; generating a bias power (BP) pulse by triggering a delay relative to the first SP pulse; providing the BP pulse at a second coupling electrode of the vacuum chamber; and performing a plasma deposition or etch process on a substrate disposed in the vacuum chamber, wherein providing the BP pulse accelerates ions from the plasma towards the substrate.

Example 17

The method of example 16, wherein the delay includes an offset duration between about −15 µs and about 20 µs; and a leading edge of the BP pulse is separated from a trailing edge of the first SP pulse by the offset duration.

Example 18

The method of one of examples 16 and 17, further including generating a second SP pulse using the first function generator, wherein a trailing edge of the BP pulse is separated from a leading edge of the second SP pulse by an offset duration that is greater than zero seconds.

Example 19

The method of one of examples 16 to 18, further including generating a second SP pulse using the first function generator, wherein a trailing edge of the BP pulse overlaps with a leading edge of the second SP pulse by an offset duration that is greater than zero seconds.

Example 20

The method of one of examples 16 to 19, further including generating a second SP pulse using the first function generator, wherein a leading edge of the first SP pulse is separated from a leading edge of the second SP pulse by a pulse modulation period that is between about 200 µs and about 1000 µs.

The power control techniques as described herein may be controlled by a controller. It is also noted that the controller may be implemented using one or more programmable integrated circuits that are programmed to provide the functionality described herein. For example, one or more processors (e.g., microprocessor, microcontroller, central processing unit, etc.), programmable logic devices (e.g., CPLD (complex programmable logic device), FPGA (field programmable gate array), etc.), and/or other programmable integrated circuits may be programmed with software or other programming instructions to implement any of the functionality described herein. It is further noted that the software or other programming instructions may be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions, when executed by the programmable integrated circuits, cause the programmable integrated circuits to perform the processes, functions, and/or capabilities described herein. Other variations of the above could also be implemented.

One or more deposition processes may be used to form material layers using the plasma process described herein. For a plasma deposition process, a precursor gas mixture may be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Similarly, one or more etch processes may be used to etch material layers using the plasma process described herein. For example, plasma etch processes may be implemented using plasma containing fluorocarbons, oxygen, nitrogen, hydrogen, argon, and/or other gases. In addition, operating variables for process steps, for example, the chamber temperature, chamber pressure, flowrates of gases, frequency and/or power applied to electrode assembly in the generation of plasma, and/or other operating variables for the processing steps may be controlled. Variations of the above may also be implemented while still taking advantage of the techniques described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiments of FIGS. 3-7 may be combined in further embodiments. It is therefore intended that the appended claims encompass any such modifications or embodiments.

What is claimed is:

1. A plasma processing system comprising:
    a vacuum chamber;
    a first coupling electrode configured to provide power for generation of a plasma in the vacuum chamber by coupling source power (SP) pulses to the plasma;
    a substrate holder disposed in the vacuum chamber, the substrate holder being configured to support a substrate;
    a second coupling electrode configured to couple bias power (BP) pulses to the substrate;
    a timing circuit configured to generate a delay causing a first nonzero offset duration separating trailing edges of the SP pulses and leading edges of the BP pulses and to generate a trigger signal immediately following the first nonzero offset duration;
    an SP pulse modulation circuit coupled to an input of the timing circuit, the SP pulse modulation circuit configured to receive SP pulse parameters and output SP pulse signals corresponding to the SP pulses to the timing circuit, the delay being triggered by leading edges of the SP pulse signals or trailing edges of the SP pulse signals; and
    a BP pulse modulation circuit coupled to an output of the timing circuit and configured to receive BP pulse parameters different from the SP pulse parameters and output BP pulse signals triggered by the trigger signal and corresponding to the BP pulses.

2. The plasma processing system of claim 1, wherein the first coupling electrode is inductively coupled to the plasma, and wherein the plasma processing system comprises a inductively coupled plasma processing system.

3. The plasma processing system of claim 1, further comprising an SP function generator configured to generate the SP pulses using the SP pulse signals,
    wherein the timing circuit is configured to be triggered by the trailing edges of the SP pulse signals and generate the delay, and
    wherein the SP pulse modulation circuit comprises a first output coupled to an input of the SP function generator and configured to supply the SP pulse signals to the SP function generator, and a second output coupled to the timing circuit and configured to supply the SP pulse signals to the timing circuit.

4. The plasma processing system of claim 3, wherein the timing circuit is further configured to cause a second offset duration separating trailing edges of the BP pulses and leading edges of the SP pulses using the delay.

5. The plasma processing system of claim 3, wherein the SP pulse parameters comprise an SP pulse frequency and an SP pulse width, and wherein the BP pulse parameters comprise a BP pulse frequency and a BP pulse width.

6. The plasma processing system of claim 3, wherein the SP function generator is configured to generate the SP pulses by modulating the SP pulse signals received from the SP pulse modulation circuit with an alternating current (AC) signal generated at a first frequency.

7. The plasma processing system of claim 6, further comprising:
    a BP function generator coupled to the BP pulse modulation circuit and configured to generate the BP pulses by modulating the BP pulse signals with an AC signal generated at a second frequency, wherein the second frequency is less than about 15 MHz, and wherein the first frequency is greater than about 10 MHz.

8. An apparatus comprising:
    a vacuum chamber;
    a coupling electrode coupled to a source power (SP) supply node and configured to generate a plasma within the vacuum chamber using a first sequence of SP pulses;
    a substrate holder coupled to a bias power (BP) supply node and disposed within the vacuum chamber, the substrate holder being configured to support a substrate to be processed by ions of the plasma accelerated towards the substrate by a second sequence of BP pulses;
    a timing circuit configured to generate a delay causing a nonzero offset duration separating trailing edges of the first sequence and leading edges of the second sequence and to generate a trigger signal immediately following the nonzero offset duration, the delay being triggered by leading edges of the first sequence or the trailing edges of the first sequence;
    an SP pulse modulation circuit coupled to an input of the timing circuit, the SP pulse modulation circuit configured to receive SP pulse parameters and output SP pulse signals corresponding to the SP pulses to the timing circuit; and
    a BP pulse modulation circuit coupled to an output of the timing circuit and configured to receive BP pulse parameters different from the SP pulse parameters and to output BP pulse signals triggered by the trigger signal and corresponding to the BP pulses.

9. The apparatus of claim 8, wherein the SP pulses and the BP pulses are at least partially non-overlapping in time.

10. The apparatus of claim 8, wherein the coupling electrode is a resonant coupling electrode.

11. The apparatus of claim 10, further comprising:
a function generator; and
a directional coupler comprising an output directly coupled to the resonant coupling electrode with no intervening impedance matching network, and an input directly coupled to the function generator with no intervening impedance matching network.

12. The apparatus of claim 10, wherein the resonant coupling electrode is a helical resonator antenna.

13. A method of plasma processing comprising:
using a first pulse modulation circuit, outputting a first signal to both a first function generator and a timing circuit;
generating a first source power (SP) pulse using the first function generator in response to the first signal;
providing the first SP pulse at a first coupling electrode of a vacuum chamber to generate a plasma;
triggering a delay using the timing circuit in response to detecting a leading edge of the first signal or a trailing edge of the first signal, the leading edge of the first signal corresponding with a leading edge of the first SP pulse and the trailing edge of the first signal corresponding with a trailing edge of the first SP pulse, wherein the delay causes a first nonzero offset duration between the trailing edge of the first SP pulse and the leading edge of a subsequent bias power (BP) pulse during which no source power or bias power is provided to the vacuum chamber;
generating a trigger signal immediately following the first nonzero offset duration;
generating a BP pulse triggered by the trigger signal;
providing the BP pulse at a second coupling electrode of the vacuum chamber; and
performing a plasma deposition or etch process on a substrate disposed in the vacuum chamber, wherein providing the BP pulse accelerates ions from the plasma towards the substrate.

14. The method of claim 13, wherein:
the first nonzero offset duration is between about 15 µs and about 20 µs.

15. The method of claim 13, further comprising:
generating a second SP pulse using the first function generator, wherein a trailing edge of the BP pulse is separated from a leading edge of the second SP pulse by a second nonzero offset duration that is greater than zero seconds.

16. The method of claim 13, further comprising:
generating a second SP pulse using the first function generator, wherein the leading edge of the first SP pulse is separated from a leading edge of the second SP pulse by a pulse modulation period that is between about 200 µs and about 1000 µs.

17. The plasma processing system of claim 1, further comprising:
an SP function generator, wherein the first coupling electrode is a resonant coupling electrode; and
a directional coupler comprising an output directly coupled to the resonant coupling electrode with no intervening impedance matching network, and an input directly coupled to the SP function generator with no intervening impedance matching network.

18. The plasma processing system of claim 17, wherein the resonant coupling electrode is a helical resonator antenna.

* * * * *